(12) United States Patent
Asano et al.

(10) Patent No.: US 7,701,032 B2
(45) Date of Patent: Apr. 20, 2010

(54) COMPOUND SEMICONDUCTOR DEVICE

(75) Inventors: Tetsuro Asano, Gunma (JP); Yuichi Kusaka, Gunma (JP); Mikito Sakakibara, Saitama (JP)

(73) Assignee: SANYO Electric Co., Ltd., Osaka (JP)

( * ) Notice: Subject to any disclaimer, the term of this patent is extended or adjusted under 35 U.S.C. 154(b) by 342 days.

(21) Appl. No.: 11/442,600

(22) Filed: May 30, 2006

(65) Prior Publication Data

US 2006/0289963 A1    Dec. 28, 2006

(30) Foreign Application Priority Data

May 31, 2005  (JP) .............................. 2005-158578

(51) Int. Cl.
*H01L 29/80*  (2006.01)
(52) U.S. Cl. ..................... 257/504; 257/280; 257/536; 257/E21.542
(58) Field of Classification Search ................. 257/256, 257/271–275, 277, 280, 282–284, 504, 536, 257/E21.542, E21.574
See application file for complete search history.

(56) References Cited

U.S. PATENT DOCUMENTS

| | | | | |
|---|---|---|---|---|
| 5,187,110 A * | 2/1993 | Aina et al. | .................. | 438/235 |
| 5,523,593 A * | 6/1996 | Kagaya et al. | .............. | 257/192 |
| 6,376,893 B1 | 4/2002 | Rha | | |
| 6,391,752 B1 | 5/2002 | Colinge et al. | | |
| 6,444,518 B2 | 9/2002 | Jang et al. | | |
| 6,509,615 B2 | 1/2003 | Iwata et al. | | |
| 6,580,107 B2 * | 6/2003 | Asano et al. | ................. | 257/282 |
| 6,642,599 B1 | 11/2003 | Watabe et al. | | |
| 6,646,293 B2 * | 11/2003 | Emrick et al. | ............... | 257/194 |
| 2004/0026742 A1 * | 2/2004 | Nakatsuka et al. | .......... | 257/368 |

FOREIGN PATENT DOCUMENTS

| | | |
|---|---|---|
| EP | 0 588 565 | 3/1994 |
| JP | 11-233619 | 8/1999 |
| JP | 2002-33383 | 1/2002 |
| JP | 2004-134589 A | 4/2004 |
| TW | 472302 | 1/2002 |
| TW | 544908 | 8/2003 |

* cited by examiner

*Primary Examiner*—David Vu
*Assistant Examiner*—Earl N Taylor
(74) *Attorney, Agent, or Firm*—Morrison & Foerster LLP

(57) ABSTRACT

A separation element formed of one of a conduction region and a metal layer is placed between two elements in proximity to each other. The separation element is connected to a high resistance element and to a direct current terminal pad. A connection route extending from the direct current terminal pad to the separation element is a route in which a potential does not vibrate with high frequency. This results in a placement of a high frequency GND potential between the two elements, at least one of which is subjected to transmitting the high frequency signals, whereby leak of the high frequency signals can be prevented between the two elements.

18 Claims, 12 Drawing Sheets

FIG.15A

| First element or Second element | | |
|---|---|---|
| Undoped (GaAs) semi-insulating substrate | First conduction region | Operation region of ion-implanting type FET |
| | | Resistor |
| | First metal layer | Electrode pad |
| | | Wiring |
| | | Gate wiring |
| | Capacitor | |
| Epitaxial substrate for HEMT | First conduction region | Operation region of HEMT |
| | | Resistor |
| | First metal layer | Electrode pad |
| | | Wiring |
| | | Gate wiring |
| | Capacitor | |
| Epitaxial substrate for HBT | First conduction region | Operation region of HBT |
| | | Resistor |
| | First metal layer | Electrode pad |
| | | Wiring |
| | Capacitor | |

FIG.15B

| Separation Element | |
|---|---|
| Undoped (GaAs) semi-insulating substrate | Second conduction region |
| | Second metal layer |
| Epitaxial substrate for HEMT | Second conduction region |
| | Second metal layer |
| Epitaxial substrate for HBT | Second conduction region |
| | Second metal layer |

COMPOUND SEMICONDUCTOR DEVICE

BACKGROUND OF THE INVENTION

1. Field of the Invention

The present invention relates to a compound semiconductor device, and more particularly to a compound semiconductor device which is improved in isolation thereof.

2. Description of the Related Art

A monolithic microwave integrated circuit (MMIC) of a compound semiconductor device uses microwaves having a GHz band in many cases, thus resulting in an increasing demand for improvement in isolation.

For example, in a case where two elements (any of an FET, a wiring, an electrode pad, and an impurity region) are placed in proximity to each other in the same chip, a technology, in which a high concentration impurity region is placed between the two elements, is known. The high concentration impurity region improves the isolation between these two elements either by using a floating potential or by applying a GND (ground) potential. This technology is described for instance in Japanese Patent Application Publication No. 2004-134589.

As described in the patent application publication, when the high concentration impurity region to which a GND potential is applied is placed between the two elements (for example, two adjacent FETs) in proximity to each other, high frequency signals which transmit in the FET leak to the GND potential in some cases.

That is to say, carriers drift by the bias between the two FETs and the high concentration impurity region being at the GND potential so that the high frequency signals which transmit in the two FETs leak via the high concentration impurity region to the ground. Accordingly, there has been a problem where an increase in insertion loss is observed in a case of switch MMIC, for example.

On the other hand, when the high concentration impurity region in an electrically floating state in potential is placed between two elements (for example, FETs) in proximity thereto, the small amplitude high frequency signals leaking from the FET to a substrate can be absorbed by the high concentration impurity region, thereby resulting in improved isolation between the two FETs.

However, when large amplitude high frequency signals leak from the FET to the substrate, the potential itself of the high concentration impurity region in the electrically floating state in potential varies. This is because the power of the leaked high frequency signals is so large that the potential of the high concentration impurity region varies. As a result, there arises a problem that sufficient isolation cannot be ensured between the two elements such as the FET, and the like.

SUMMARY OF THE INVENTION

The invention provides a compound semiconductor device that includes a compound semiconductor substrate, a first device element formed on the substrate and receiving a signal in a GHz frequency range, a first direct current terminal connected with the first device element and applying a direct current to the first device element, a second device element formed on the substrate adjacent the first device element, an isolation region disposed between the first and second device elements, a separation element that is conductive and disposed on or in the isolation region, and a high resistance element formed on the substrate. The separation element is connected with a second direct current terminal through the high resistance element.

The invention also provides a compound semiconductor device that includes a compound semiconductor substrate, a transistor formed on the substrate and receiving a signal in a GHz frequency range, a first direct current terminal connected with the transistor and applying a direct current to the transistor, a device element formed on the substrate adjacent the transistor, an isolation region disposed between the device element and the transistor, a separation element that is conductive and disposed on or in the isolation region, and a high resistance element formed on the substrate. The separation element is connected with a second direct current terminal through the high resistance element.

The invention further provides a compound semiconductor device that includes a compound semiconductor substrate, a first switching element formed on the substrate and receiving a signal in a GHz frequency range, a direct current terminal connected with the first switching element and applying a direct current to the first switching element, a second switching element formed on the substrate and disposed adjacent the first switching element, an isolation region disposed between the first and second switching elements, a separation element that is conductive and disposed on or in the isolation region, and a high resistance element formed on the substrate. The separation element is connected with the direct current terminal through the high resistance element.

BRIEF DESCRIPTION OF THE DRAWINGS

FIG. 15 is a table for describing the first embodiments of the present invention.

DESCRIPTION OF THE EMBODIMENTS

Figure 1A:
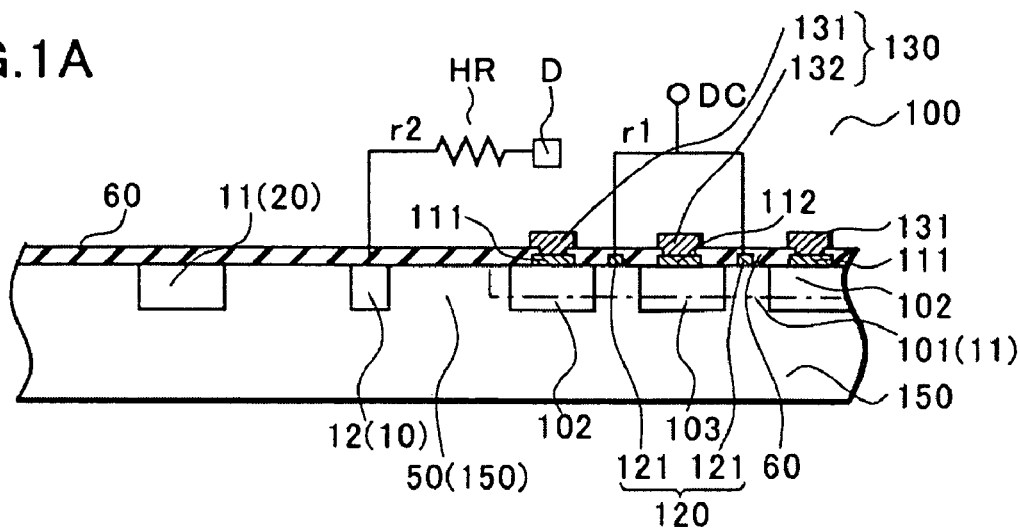
FIG. 1 is a schematic cross-sectional view for describing a first embodiments of the present invention.

With reference to FIGS. 1 to 17, embodiments of the present invention will be described in detail.

A compound semiconductor device according to the embodiments of the present invention includes a compound semiconductor substrate on which a plurality of elements including a transistor are integrated. The transistor is applied via a first route with a direct current potential that becomes a ground potential as high frequency signals (hereinafter referred to as a high frequency GND potential). Of the plurality of elements, the first and second elements are isolated by a isolation region. The high frequency signals are transmitted through at least one of the first and second elements.

A separation element is placed on the compound semiconductor substrate between the first and second elements. The separation element is connected to a high resistance element and applied via a second route with a direct current potential that becomes the high frequency GND potential. This allows the separation element to block the leak of high frequency signals which are transmitted through at least one of the first and second elements.

The transistor includes GaAs MESFET (Metal Semiconductor Field Effect Transistor), GaAs JFET (Junction FET), HEMT (High Electron Mobility Transistor), HBT (Heterojunction Bipolar Transistor) which are formed on the compound semiconductor substrate.

The first and second elements are adjacently placed via an isolation region. The first element is one of a first conduction region, a first metal layer, and a capacitor. The first conduction region is an operation region of the transistor or a resistor, and the first metal layer is a wiring which is connected to the transistor or an electrode pad.

The second element is also one of the first conduction region, the first metal layer, and the capacitor. The first conduction region is the operation region of the transistor or the resistor, and the first metal layer is the wiring which is connected to the transistor or the electrode pad.

Here, the conduction region of the present embodiment is a region where for example, n type impurities are ion-implanted into a semi-insulating compound semiconductor substrate which is undoped. Alternatively, this is the resultant region formed by isolating an epitaxial layer of the compound semiconductor substrate including impurities with the isolation region, and specifically, the operation region, the resistor, or an impurity region that is arranged around the metal layer for the purpose of improving isolation.

The isolation region is an insulating region which is a part of a semi-insulating substrate (the undoped compound semiconductor substrate) or insulated by ion-implanting impurities (boron, hydrogen or oxygen) into the epitaxial layer containing impurities on the semi-insulating compound semiconductor substrate.

That is, the insulating region is a region which is not completely electrically insulator but is a part of the semi-insulating substrate (the undoped compound semiconductor substrate) or insulated by providing carrier traps in epitaxial layer (the semiconductor layer) containing impurities by ion-implanting impurities (boron, hydrogen or oxygen). In the latter case, although impurities exist as the epitaxial layer also in the insulating region, the impurities are inactivated by implantation of the impurities (boron, hydrogen or oxygen) for insulation. And resistivity of the insulating region is equal to or more than $1\times10^7$ Ω·cm and equal to or less than $1\times10^9$ Ω·cm. On the other hand the resistivity of insulator like glass, ceramics, gum, Si dioxide film or Si nitride film is more than $1\times10^{10}$ Ω·cm. Namely the insulating region is clearly distinguished from insulator like glass, ceramics, gum, Si dioxide film or Si nitride film at resistivity value too. Actually the insulating region is "semiconductor", and insulator like glass, ceramics, gum, Si dioxide film or Si nitride film is not "semiconductor". That is, the semiconductor and insulator are substantially different.

The separation element is configured of a second conduction region or a second metal layer, and connected via a high resistance element to a direct current terminal pad to which the high frequency GND potential is applied. The resistance value of the high resistance element is 5 kΩ to 10 kΩ or more. When the separation element is configured of the second metal layer, a third conduction region should be placed on the surface of the compound semiconductor substrate located below the second metal layer to improve isolation. The second metal layer and the third conduction region are in direct contact with each other to form a Schottky junction or an ohmic junction. Alternatively, the second metal layer is placed on the third conduction region via an insulating film so that they are to be isolated from each other in a state where a direct current is not allowed to flow (hereinafter referred to as "DC-isolated"). It should be noted that the third conduction region does not have to be placed.

The third conduction region may be placed around the first metal layer which is the first element or the second element, thereby resulting in an improved isolation.

With reference to FIGS. 1A to 15, as a first embodiment, an example of the placement of the first element, the second element, and a separation element 10 is described below.

FIG. 1 shows a case in which the conductive regions are formed on a undoped GaAs semi-insulating substrate (a compound semiconductor substrate) 150 by ion implantation, and in which the first element is a resistor 20, and the second element is an operation region 101 of a MESFET 100.

The operation region 101 of the MESFET 100 is a first conduction region 11 which is an n type impurity ion-implanted region on the GaAs semi-insulating substrate 150. The MESFET 100 is connected to a direct current terminal DC which serves as the high frequency GND potential, and applied with a direct current potential through a first route r1.

In the operation region 101, a source region 102 and a drain region 103 are placed which are an n type impurity ion-implanted region having high concentration. The source region 102 and the drain region 103 are connected to a source electrode 111 and a drain electrode 112, respectively, which are an ohmic metal layer as a first source electrode and a first drain electrode respectively, and to a source electrode 131 and a drain electrode 132, respectively, which are a wiring metal layer (Ti/Pt/Au) 130 as a second source electrode and a second drain electrode respectively. In a partial area of the operation region 101 between the source region 102 and the drain region 103, a gate electrode 121 which is a gate metal layer 120 is Schottky-connected to the operation region 101. The surfaces of the gate electrode 121 and the operation region 101 therearound are covered with a nitride film 60.

The resistor 20 is a first conduction region 11 which is a high concentration n type impurity ion-implanted region on the GaAs semi-insulating substrate 150. A isolation region 50 is placed between the resistor 20 and the MESFET 100. In this case, the isolation region 50 is a part of the GaAs semi-insulating substrate 150.

FIG. 1A shows the case in which the separation element 10 serves as a second conduction region 12. The separation element 10 is placed between the resistor 20 and the operation region 101 on the surface of the substrate 150. Furthermore, the separation element 10 is spaced apart from respective ends of the resistor 20 and the operation region 101 by a distance (for example, about 4 μm) that allows a predetermined isolation to be maintained. The second conduction region 12 is an n type high concentration impurity region, and has an impurity concentration of $1 \times 10^{17}$ cm$^{-3}$ or higher. FIG. 1A shows the separation element 10 which is thereon covered with an insulating film 60 such as a nitride film.

The separation element 10 is connected via a high resistance element HR of 5 kΩ to 10 kΩ or more to a direct current terminal pad D. The direct current terminal pad D is provided on the same GaAs substrate 150 as that on which the separation element 10 is placed. The separation element 10 is applied with a direct current potential as the high frequency GND potential from the direct current terminal pad D through a second route r2.

In the present embodiment, the separation element 10 is placed between the first and the second elements. The separation element 10 is the second conduction region 12 being at the high frequency GND potential. This dramatically weakens the direct electric field strength between the first element (the resistor 20) and the second element (the MESFET 100). Thus, high frequency signals can be prevented from leaking between the first and second elements.

Furthermore, the high frequency signals which leak from the first or second element to the isolation region 50 is absorbed by the separation element 10 (the second conduction region 12) so that the leak of the high frequency signals between the first and second elements can be further reduced. At this time, the high frequency signals which leak to and is absorbed by the separation element 10 do not reach the direct current terminal pad D because the high resistance element HR of 5 kΩ to 10 kΩ or more is connected between the separation element 10 (the second conduction region 12) and the direct current terminal pad D.

Therefore, the high frequency signals do not leak from the first or second element via the separation element 10 to the direct current terminal pad D being at a high frequency GND potential, whereby the high frequency properties of the compound semiconductor device is not deteriorated.

Figure 1B:
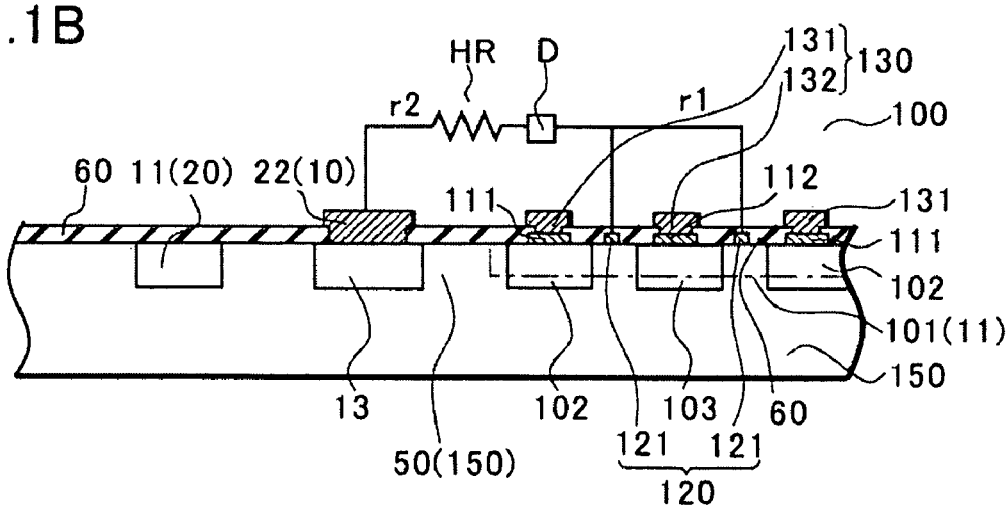

FIG. 1B shows the case in which the separation element 10 is a second metal layer 22. The second metal layer 22 is constructed of, for example, the same metal layer as the wiring metal layer 130 of the MESFET 100. The separation element 10 is placed between the resistor 20 and the operation region 101 on the surface of the substrate 150. Also, the separation element 10 is spaced apart from respective ends of the resistor 20 and the operation region 101 by a distance (for example, about 4 μm) that allows a predetermined isolation to be maintained. The second metal layer 22 is directly fixed to the substrate 150 by forming an opening portion in the nitride film 60 and forms an ohmic junction or a Schottky junction.

The second metal layer 22 is allowed to be in contact with the isolation region 50 (the undoped GaAs semi-insulating substrate 150) or with a third conduction region 13 which is provided on the surface of the substrate 150 as shown in FIG. 1B. The third conduction region 13 is connected to the second metal layer 22 in a state where a direct current is allowed to flow (hereinafter referred to as "DC-connected"), and provided on the entire under surface of the second metal layer 22 (or below around the second metal layer 22) while extending over the edge of the second metal layer 22. Furthermore, the third conduction region 13 may be provided around the second metal layer 22 spaced apart from the second metal layer 22 about 5 μm or less and be DC-connected to the second metal layer.

When the separation element 10 forms a Schottky junction with the substrate 150, a depletion layer is extended to the substrate 150 by the direct current potential applied to the separation element 10. When the depletion layer reaches the element such as the operation region 101 adjacent to the separation element 10, the high frequency signals are likely to leak. For this reason, the third conduction region 13 is placed. The concentration of the impurities of the third conduction regions 13 is about 1 to $5 \times 10^{18}$ cm$^{-3}$, whereby the depletion layer extending to the substrate 150 can be prevented from reaching the adjacent element, thereby resulting in an improved isolation.

The separation element 10 is connected via the high resistance element HR to the direct current terminal pad D. Furthermore, the MESFET 100 is here connected via the direct current terminal pad D provided on the same substrate 150 to the direct terminal DC. That is to say, the case in which the second element and the separation element 10 are connected to the common direct current terminal pad D is described.

As described above, the direct current terminal pad D may be connected to only the separation element 10, and may also be shared with the MESFET 100 (or the resistor 20) as shown in FIG. 1B.

For example, a switch circuit device has a control terminal pad, a ground terminal pad, and a voltage supply terminal pad of a logic circuit on the same substrate 150. The MESFET 100 or the resistor 20 is then connected to them to be applied with a direct current potential.

That is to say, the direct current terminal pad D to which the separation element 10 is connected may be a pad which is connected to the MESFET 100 or the resistor 20 such as the control terminal pad, the ground terminal pad, and the voltage supply terminal pad.

However, when the direct current terminal pad D which is connected to the first or second element and the direct current terminal pad D which is connected to the separation element 10 are in common use, the separation element 10 and the direct current terminal pad D are connected to each other by a route different from the connection route between the first or second element and the direct current terminal pad D.

That is, when the MESFET 100 and the separation element 10 share the direct current terminal pad D as shown in FIG. 1B, the MESFET 100 is connected to the direct current terminal pad D by the first route r1, and the direct current terminal pad D is connected to the separation element 10 by the second route r2 different from the first route r1. The same is true for the resistor 20.

For example, in the switch circuit device, the control terminal pad is connected to the MESFET 100 by the resistor 20 in some cases. In this case, the control terminal pad is connected to the resistor 20 and the MESFET 100 by the first route r1, and the second route r2 different from the route r1 is used to connect the separation element 10 to the direct current terminal pad D (the control terminal pad).

Note that the first and second routes r1 and r2 may extend from the direct current terminal pad D through completely different routes from the direct current terminal pad D, respectively or through one route near the direct current terminal pad D which branches at midpoint into two routes, the first and second routes r1 and r2 near these elements. That is, the second route r2 is never completely overlapped with any first route. Here, the second route r2 is a route in which the potential does not vibrate with high frequency by a cause other than the leak of high frequency signals from the first or second element. In respect to this, a description will be given later.

The other construction elements such as the MESFET 100, the resistor 20, and the like are the same as those shown in FIG. 1A. Furthermore, the function of the separation element

10 by which the leak of the high frequency signals is blocked between the first and second elements can be described in the same manner as in FIG. 1A.

Figure 1C:
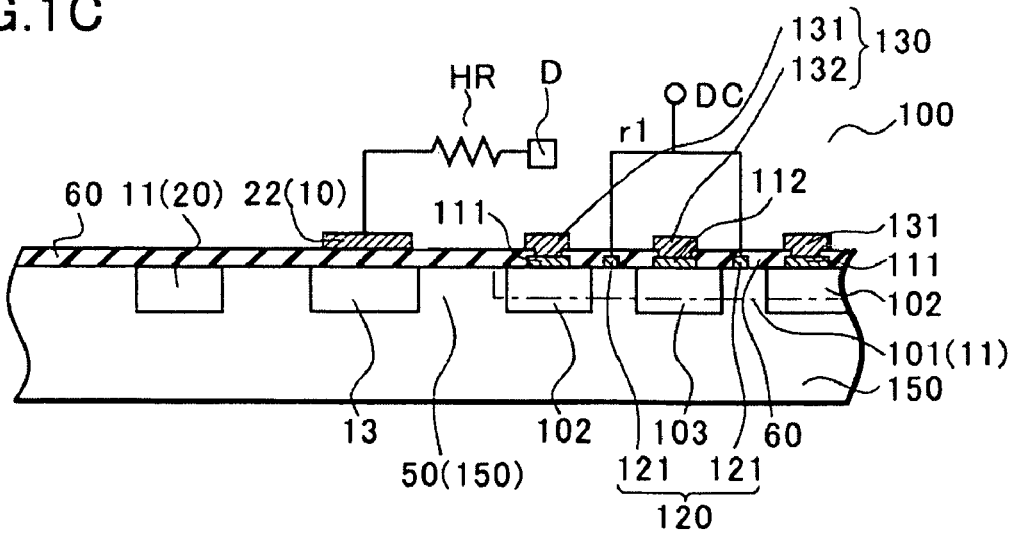

FIG. 1C shows the case in which the separation element 10 is constructed of the second metal layer 22 and placed on the nitride film 60.

The separation element 10 is connected via the high resistance element HR to the direct current terminal pad D. This can prevent the high frequency signals from leaking between the resistor 20 and the MESFET 100. The function of the separation element 10 by which the leak of the high frequency signals is blocked between the first and second elements can be described in the same manner as in FIG. 1A.

However, the high frequency signals which are leaked from the first or second element to the isolation region 50 are absorbed by the separation element 10 via the nitride film 60. The separation element 10 is here the second metal layer 22 being at the high frequency GND potential. Direct current does not flow through the nitride film 60, but the high frequency signals penetrate the nitride film 60. In this case, the third conduction regions 13 should be placed while extending over the edge of the separation element 10 on the surface of the substrate 150 beneath the separation element 10 as shown in FIG. 1C. That is, when a carrier charging and discharging signal extends from the first or second element toward the separation element 10, the placement of the third conduction regions 13 allows the carrier charging and discharging signal to be prevented from reaching immediately beneath the separation element 10. Accordingly, the isolation between the first element (the resistor 20) or the second element (the MESFET 100) and the separation element 10 can be improved.

Other construction elements are the same as those in FIGS. 1A and 1B.

A mechanism is described below in which high frequency signals leak between the first and second elements in proximity to each other, where high frequency signals transmit on at least one of the elements.

Firstly, the first and second elements in proximity to each other are isolated by the isolation region 50. The isolation region 50 is an insulating region that is formed by a part of the semi-insulating substrate 150 or insulating an epitaxial layer of the substrate 150 containing impurities for forming a semiconductor device by means of ion implantation of boron, hydrogen or oxygen for insulation. Therefore, the narrow width of the isolation region 50 allows high frequency signals to pass itself which serves as a dielectric.

Secondly, when a metal layer forms a Schottky junction with the isolation region 50, the depletion layer widely expands from the Schottky junction to the isolation region 50. That is, the depletion layer extends beyond the isolation region 50 and reaches the element which is close thereto, thus, causing high frequency signals to leak.

Thirdly, when one of the first and second elements is a wiring on the insulating film (for example, the nitride film 60), the nitride film 60 serves as a dielectric to allow high frequency signals to pass. That is, when any elements isolated by the isolation region 50 from each other are close to each other, high frequency signals necessarily leak therebetween.

Fourthly, a direct high-frequency electric field is generated between the first and second elements by high frequency signals, which transmit through the first or second element. That is, a high frequency drift current due to this high frequency electric field flows via the isolation region 50. This also causes high frequency signals to leak.

In the present embodiment, high frequency signals can be prevented from leaking between the first and second elements by placing the separation element 10 between the first and second elements close to each other. The mechanism for preventing high frequency signals from leaking is described below.

The separation element 10 is constructed of the second conduction region 12 or the second metal layer 22. The separation element 10 is connected via the high resistance element HR of 5 kΩ to 10 kΩ or more, which isolates high frequency signals, to the direct current terminal pad D to which a direct current potential is applied. The direct current potential is a high frequency GND potential which, in the present embodiment, includes a ground potential, a voltage supply potential, the potential of the control signals, and the like.

That is to say, the separation element 10 is not connected to a high frequency signal transmitting route in the circuit, and the potential of the separation element 10 slightly vibrates with high frequency in some cases due to high frequency signals which leak from the first or second element, but does not vibrate with high frequency in potential by other causes. The separation element 10 is at a high frequency GND potential because it is connected via the high resistance element HR of 5 kΩ to 10 kΩ or more to the direct current terminal pad D. Therefore, the separation element 10 is placed between the first and second elements close to each other through which high frequency signals transmit, thereby resulting in a planar pattern arrangement in order of the first element, high frequency GND potential (the separation element 10), and the second element.

As described above, there exists a direct electric field between the first and second elements due to high frequency signals which transmit therethrough. However, the placement of the separation element 10 being at high frequency GND potential between the first and second elements dramatically weakens the direct electric field therebetween, whereby a high frequency current can be prevented from flowing between the first and second elements via the isolation region 50. Thus, high frequency signals can be prevented from leaking.

Note that when the potential of the separation element 10 slightly vibrates with high frequency due to high frequency signals which leak from the first or second element, high frequency properties are not deteriorated according to the present embodiment. That is, the separation element 10 is at the high frequency GND potential and vibrates with high frequency with extremely smaller vibration amplitude as compared to that generated when being at the floating potential. Moreover, the vibrations of the potential of the separation element 10 are sufficiently attenuated by the high resistance element HR to which the separation element 10 is connected so that the vibrations do not reach the direct current terminal pad D. That is to say, the high frequency vibrations of the potential of the separation element 10 are not transmitted to the direct current terminal pad D so that the high frequency properties of the circuit device are not deteriorated.

As shown in FIG. 1A, when the separation element 10 is constructed of the second conduction region 12, high frequency signals which leak to the isolation region 50 can directly be absorbed by the separation element 10 being at the high frequency GND potential.

In FIG. 1B, the separation element 10 is constructed of the second metal layer 22, which forms a Schottky junction or an ohmic junction with the substrate 150. In this case, the separation element 10 being at the high frequency GND potential can absorb the high frequency signals which leak to the isolation region 50 via the Schottky or the ohmic junction.

As shown in FIG. 1C, the nitride film 60 is sandwiched between the second metal layer 22 and the substrate 150. The high frequency signals pass the nitride film 60. In this case, the high frequency signals which leak from the first or second element to the isolation region 50 are absorbed via the nitride film 60 by the separation element 10 (the second metal layer 22) being at the high frequency GND potential. Thus, this function can prevent the high frequency signals from leaking between the first and second elements. The two kinds of mechanisms are described above and also used in subsequent embodiment.

FIG. 2 shows the case in which the first element is a capacitor 30, and the second element is the operation region 101 of the MESFET 100. The capacitor 30 is constructed such that a lower electrode 31 is provided on the substrate 150 and an upper electrode 32 is provided thereon via the nitride film 60 which serves as a dielectric. For example, the lower electrode 31 is constructed of the same metal layer as the wiring metal layer 130. The MESFET 100, as in the case shown in FIG. 1, is applied with a direct current potential from the direct current terminal DC through the first route r1. In the description hereinafter, the constituent elements which have already been described are assigned with the same reference numerals and the description thereof is omitted.

Figure 2A:
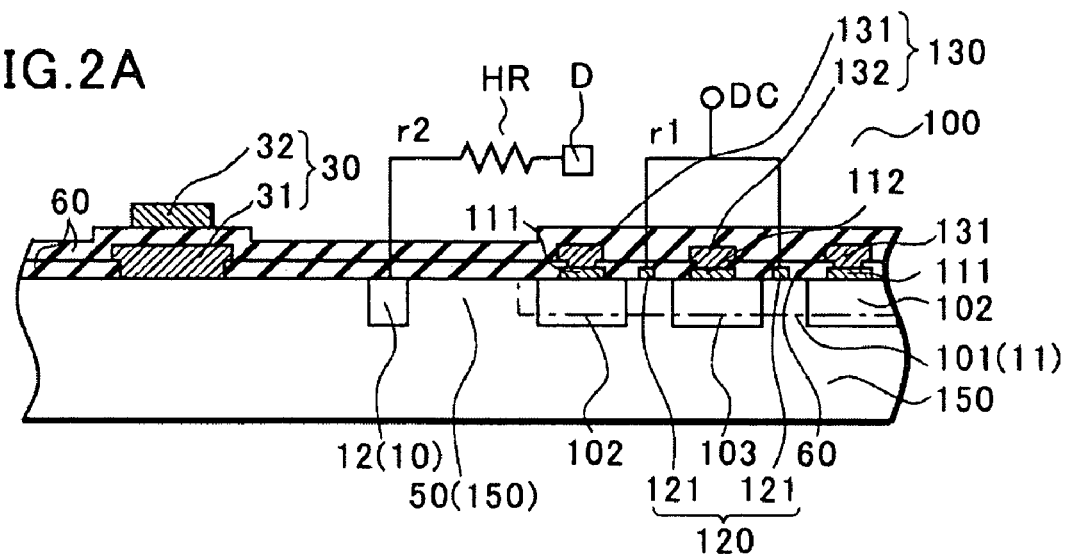
FIG. 2 is a schematic cross-sectional view for describing the first embodiments of the present invention.

FIG. 2A shows the case in which the separation element 10 is constructed of the second conduction region 12. The separation element 10 is connected via the high resistance element HR to the direct current terminal pad D, and applied with a direct current potential through the second route r2, whereby the leak of the high frequency signals between the MESFET 100 and the capacitor 30 is prevented. The direct current terminal pad D is provided on the same substrate 150 and connected to, for example, only the separation element 10. The lower electrode 31 of the capacitor 30 is brought into contact with the surface of the substrate 150 by forming an opening portion in the nitride film 60.

Figure 2B:
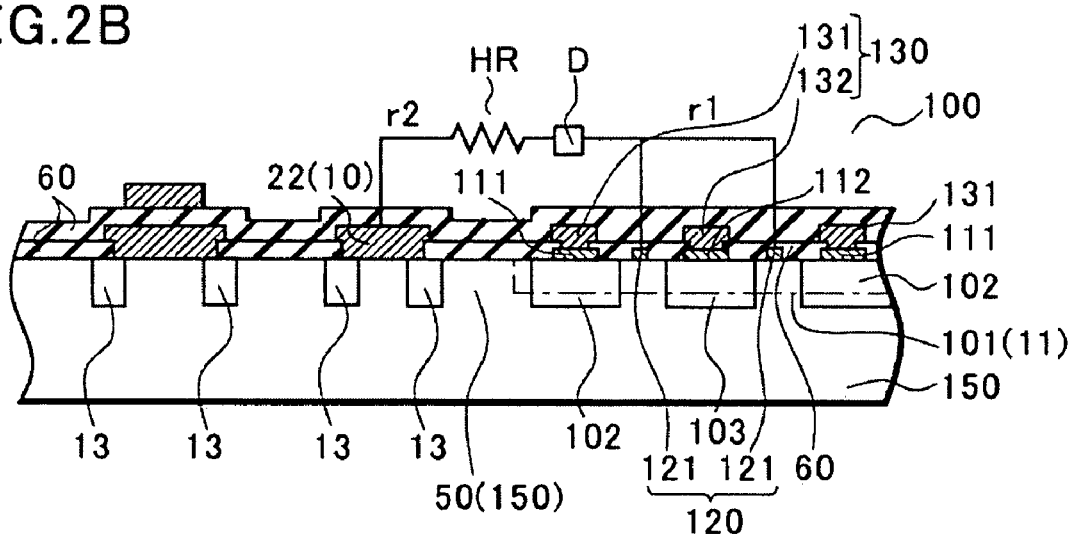

FIG. 2B shows the case in which the separation element 10 is constructed of the second metal layer 22. As shown in FIG. 2B, the direct current terminal pad D to which the separation element 10 is connected and the direct current terminal pad to which the MESFET 100 is connected may be the same electrode pad. In this case, however, the MESFET 100 is applied with a direct current potential through the first route r1 and the separation element 10 is applied with the direct current potential through the second route r2. The subsequent drawings are omitted, and the connection relationship of the separation element 10, the direct current terminal pad D, and MESFET (transistor) 100 is the same as the one described above. That is, when the first or second element and the separation element 10 share the direct current terminal pad D, the first and second routes r1 and r2 may extend from the direct current terminal pad D through completely different routes, respectively or through one route near the direct current terminal pad D which branches at midpoint into two routes, the first and second routes r1 and r2 near these elements. That is, the second route r2 is never completely overlapped with any first route r1.

The third conduction regions 13 are placed on the surface of the substrate 150 around the area in which the separation element 10 is placed to improve isolation. Here is shown the third conduction regions 13 which are placed beneath only around the separation element 10 while extending over the edge of the separation element 10. Moreover, the third conduction regions 13 should be place beneath around the lower electrode 31 of the capacitor 30. The third conduction regions 13 form a Schottky or ohmic junction with the separation element 10 and the lower electrode 31.

Figure 2C:
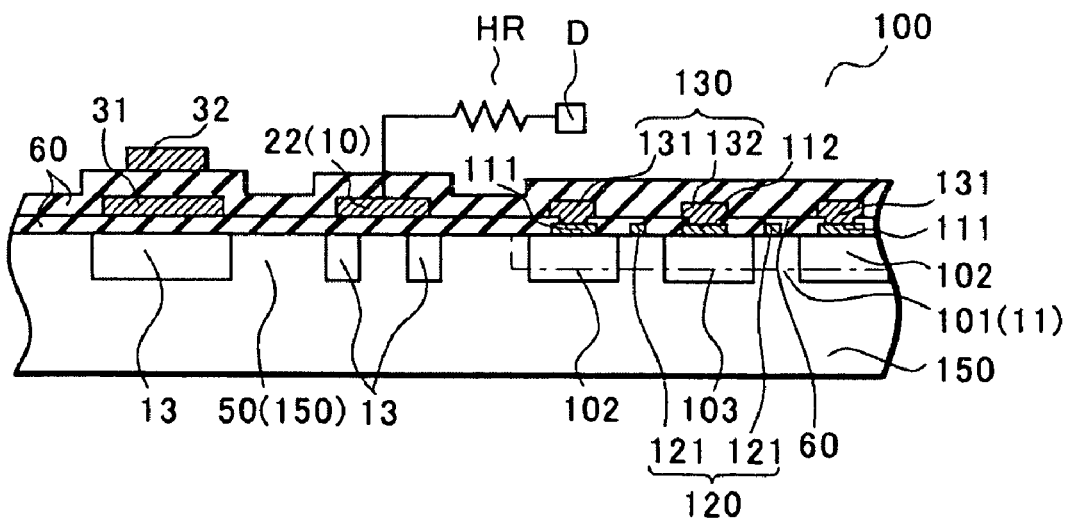

FIG. 2C shows the case in which the third conduction regions 13 are placed beneath the separation element 10 via the nitride film 60 to improve isolation. The third conduction regions 13 are placed only beneath around the separation element 10. The separation element 10 is configured of the second metal layer 22, which is DC-separated from the third conduction regions 13 therebeneath by the nitride film 60. In the capacitor 30, the lower electrode 31 is placed on the nitride film 60. The third conduction region 13 is also placed beneath the lower electrode 31 while extending over the edge of the lower electrode 31 to improve isolation. In this case, the lower electrode 31 is DC-separated between the third conduction regions 13 by the nitride film 60, but not insulated in terms of high frequency.

The third conduction regions 13 are placed to prevent high frequency signals from leaking for the purpose of improvement in isolation. In addition to this method, the present embodiment allows the high frequency signals to be prevented from leaking between the first and second elements to improve isolation.

FIG. 3 shows the case in which the first element is an electrode pad 133, and the second element is the operation region 101 of the MESFET 100. The electrode pad 133 is a first metal layer 21 connected to the MESFET 100, and is formed of the same metal layer as the wiring metal layer 130 of the MESFET 100.

Figure 3A:
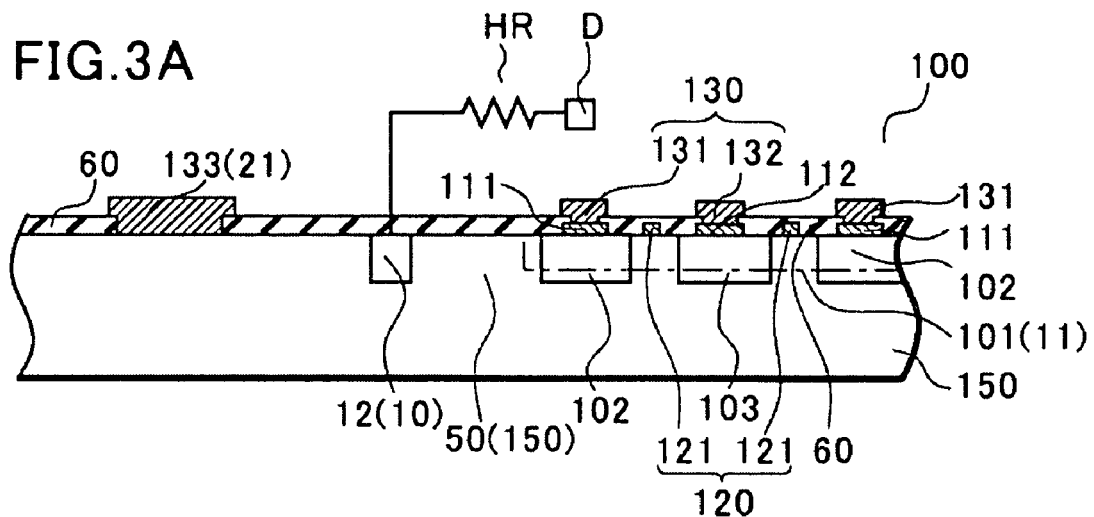
FIG. 3 is a schematic cross-sectional view for describing the first embodiments of the present invention.

In FIG. 3A, the separation element 10 is constructed of the second conduction region 12. The separation element 10 is connected via the high resistance element HR to the direct current terminal pad D. The electrode pad 133 is directly fixed to, for example, the surface of the substrate 150.

Figure 3B:
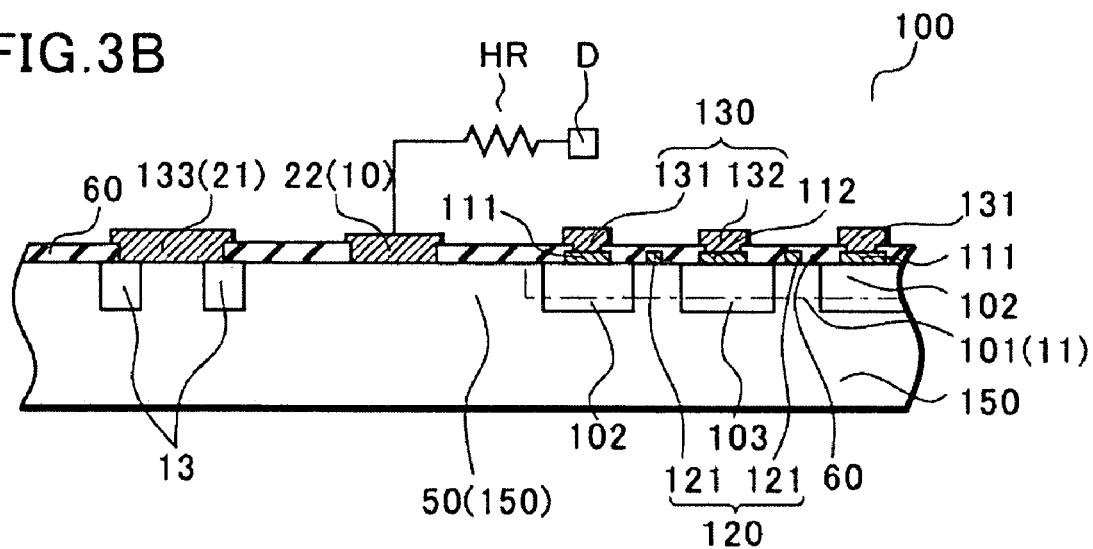

In FIG. 3B, the separation element 10 is constructed of the second metal layer 22. The second metal layer 22 is brought into contact with the surface of the substrate 150 by forming an opening portion in the nitride film 60. In such a manner, the separation element 10 may be placed on the undoped semi-insulating substrate 150 (the isolation region 50) without the third conduction region 13 being provided. The third conduction regions 13 are placed beneath around, for example, the electrode pad 133.

Figure 3C:
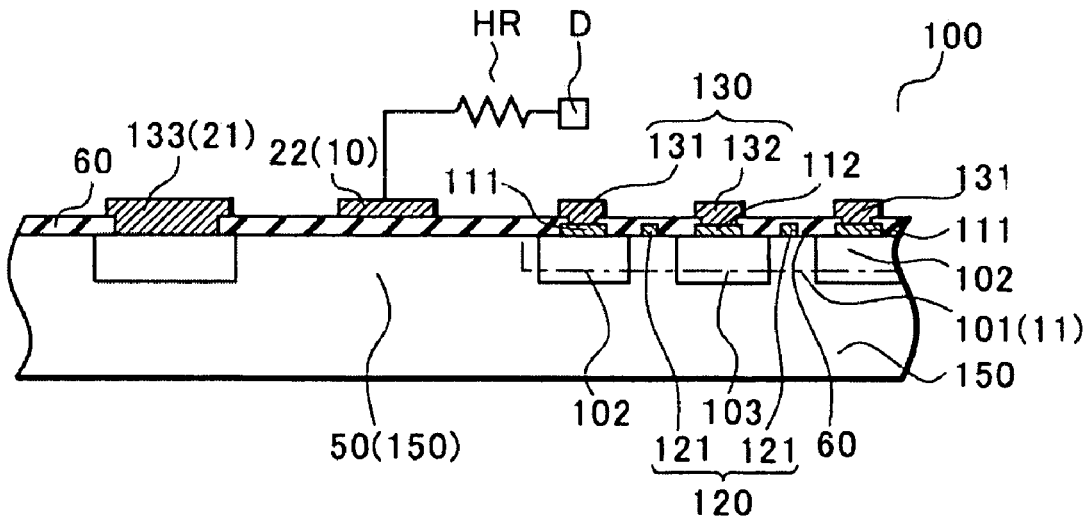

In FIG. 3C, the separation element 10 is constructed of the second metal layer 22 and placed on the nitride film 60. In this case, the third conduction region 13 may not be placed beneath the separation element 10. The third conduction region 13 is placed, for example, overall beneath the electrode pad 133. In FIGS. 3B and 3C, the third conduction regions 13 may then be placed beneath the separation element 10.

In FIG. 3, even if the electrode pad 133 is changed to the wiring connected to the MESFET 100, the description above is true.

FIG. 4 shows the case in which the first element is a wiring 134, and the second element is the operation region 101 of the MESFET 100. The wiring 134 is the first metal layer 21 which is connected to the MESFET 100, and is formed of a metal wiring layer 130 including the source electrode 131 and the drain electrode 132 which correspond to the second source electrode and the second drain electrode of the MESFET 100 respectively. The wiring 134 extends on the nitride film 60.

Figure 4A:
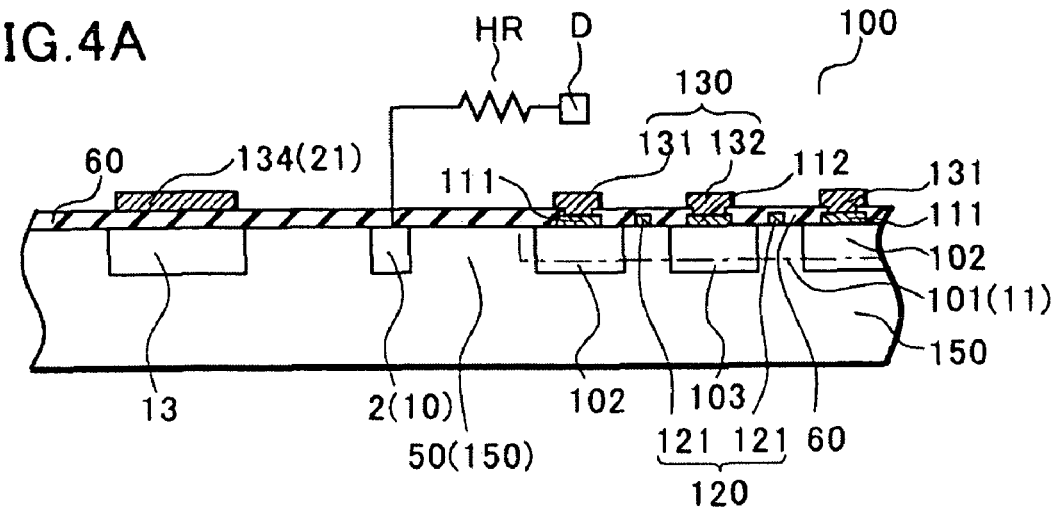
FIG. 4 is a schematic cross-sectional view for describing the first embodiments of the present invention.

In FIG. 4A, the separation element 10 is constructed of the second conduction region 12. The separation element 10 is connected via the high resistance element HR to the direct current terminal pad D. The third conduction region 13 is placed, for example, via the nitride 60 beneath the wiring 134 to improve isolation. The third conduction region 13 beneath the wiring 134 is at a floating potential to which any direct current potential is not applied. In the region in which the wiring 134 through which high frequency signals transmit is placed, the nitride film 60 becomes a capacitance component so that the high frequency signals pass the nitride film 60 to reach the substrate 150. The placement of the third conduction region 13 being at floating potential then allows the high frequency signals to be prevented from leaking in this region.

Figure 4B:
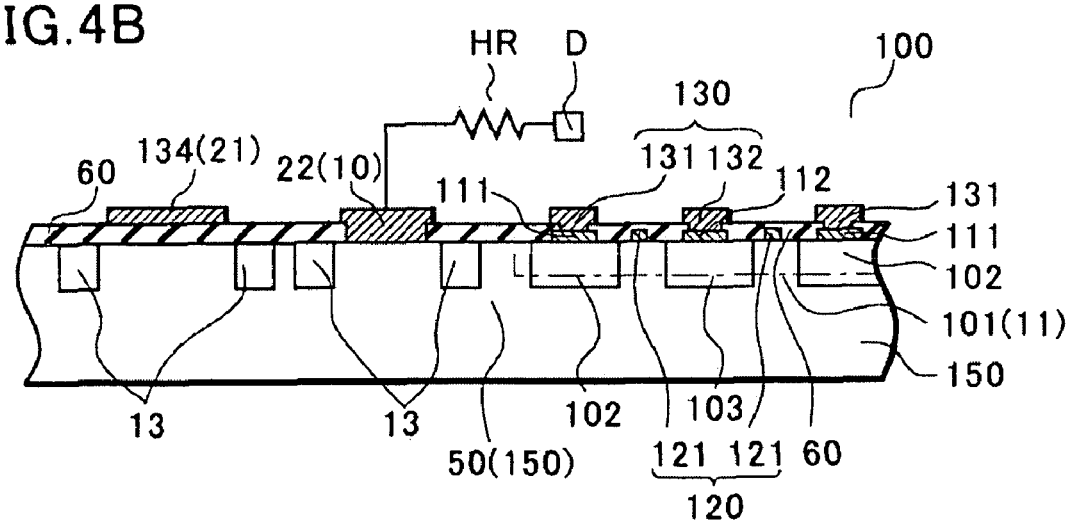

In FIG. 4B, the separation element 10 is constructed of the second metal layer 22. The second metal layer 22 is brought into contact with the surface of the substrate 150 by forming an opening portion in the nitride film 60. The third conduction region 13 is placed below the second metal layer 22 on the surface of the substrate 150 spaced apart from the second metal layer 22. If the spacing distance between the third conduction region 13 and the second metal layer 22 is about 5 µm or less, they are DC-connected to each other. That is, isolation can be improved as in the case in which the second metal layer 22 and the third conduction region 13 are at least in partial contact with each other. The third conduction region 13 is also placed below around the wiring 134 about 5 µm or less spaced apart therefrom, as in the case of the second metal layer 22.

Figure 4C:
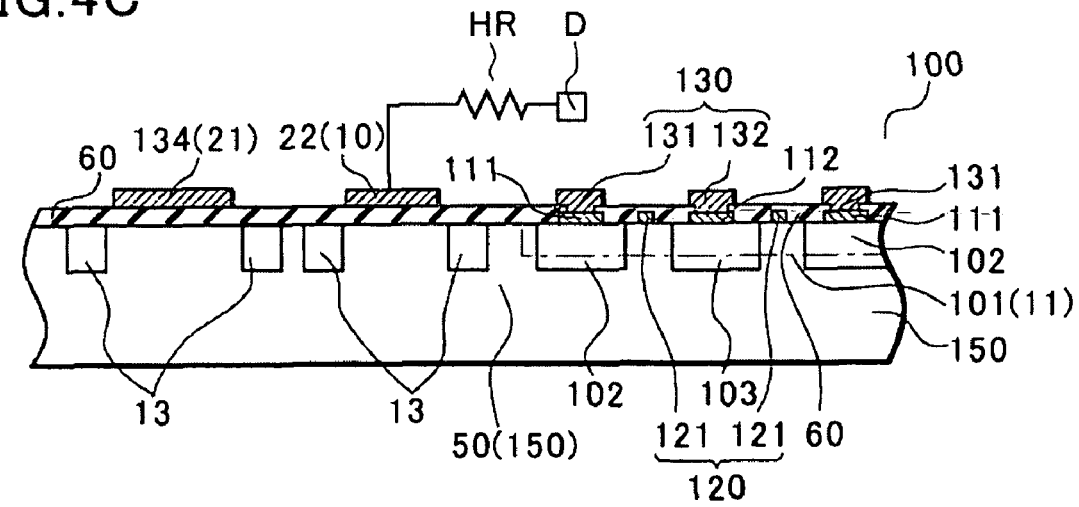

In FIG. 4C, the separation element 10 is constructed of the second metal layer 22, and placed on the nitride film 60. The DC-separated third conduction region 13 is placed below around the second metal layer 22 about 5 µm or less spaced apart therefrom. The third conduction region 13 is also placed, for example, below around the wiring 134 spaced apart therefrom.

FIG. 5 shows the case in which the first element is a gate wiring 122, and the second element is the operation region 101 of the MESFET 100. The gate wiring 122 is the first metal layer 21 connected to the MESFET 100, and formed of the gate metal layer 120 also forming the gate electrode 121 of the MESFET 100. Furthermore, the gate wiring 122 forms a Schottky junction with the surface of the substrate 150.

Figure 5A:
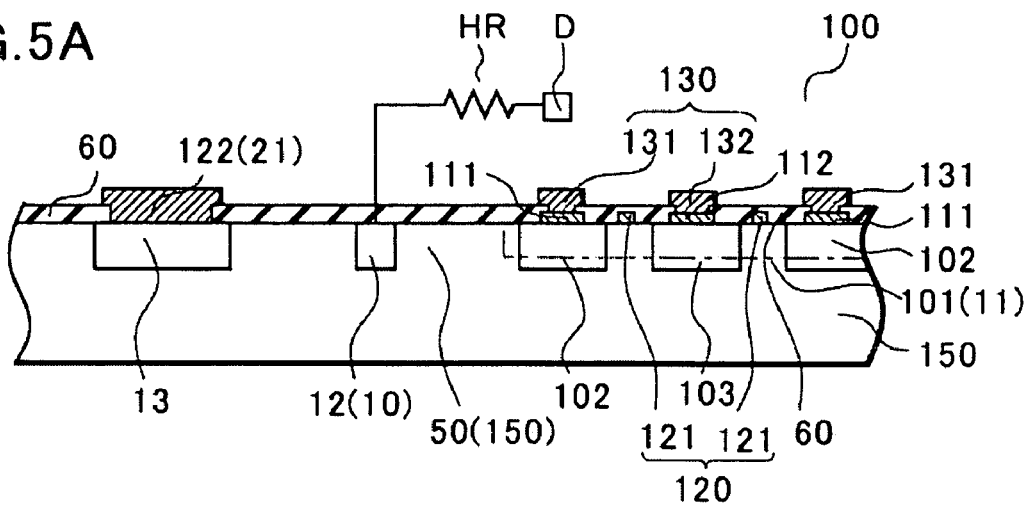
FIG. 5 is a schematic cross-sectional view for describing the first embodiments of the present invention.

In FIG. 5A, the separation element 10 is constructed of the second conduction region 12. The separation element 10 is connected via the high resistance element HR to the direct current terminal pad D. The third conduction region 13 is placed beneath the gate wiring 122.

Figure 5B:
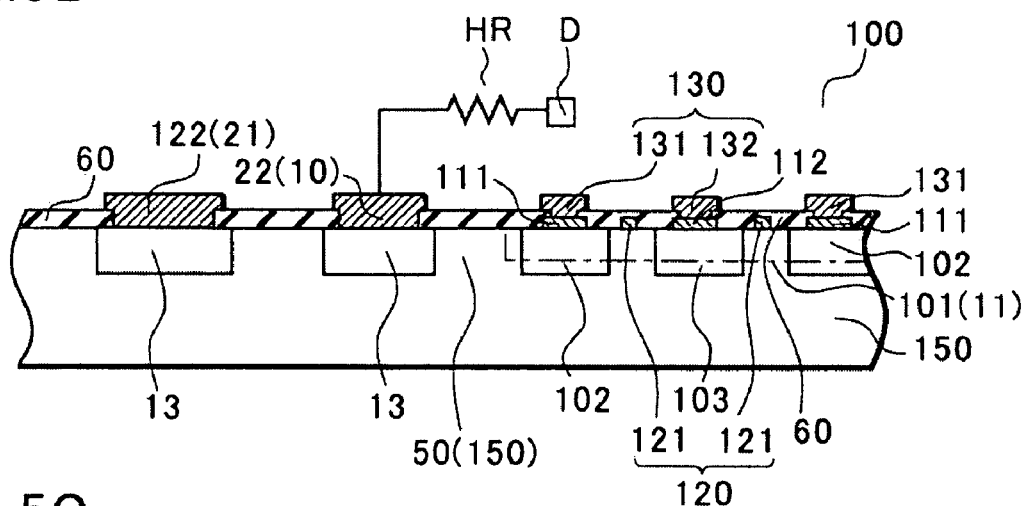

In FIG. 5B, the separation element 10 is constructed of the second metal layer 22. The second metal layer 22 is brought into contact with the surface of the substrate 150 by forming an opening portion in the nitride film 60. The third conduction region 13 is placed beneath the second metal layer 22 while being in contact with the entire surface thereof. The third conduction region 13 is placed at the entire surface of the lower part of the gate wiring 122.

Figure 5C:
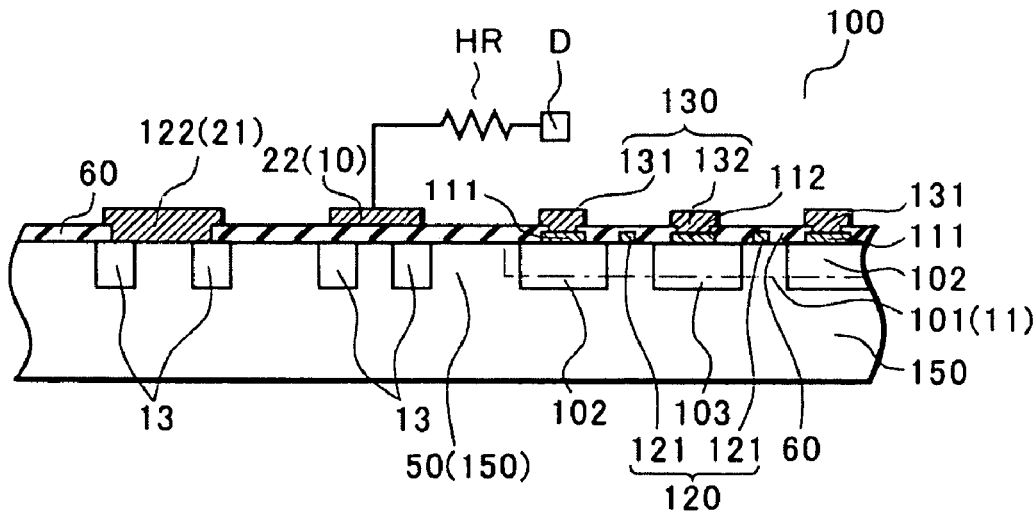

In FIG. 5C, the separation element 10 is constructed of the second metal layer 22, and placed on the nitride film 60. The third conduction region 13 which is DC-separated from the second metal layer 22 is placed beneath around the second metal layer 22. The third conduction region 13 is also placed, for example, beneath around the gate wiring 122.

Figure 6:
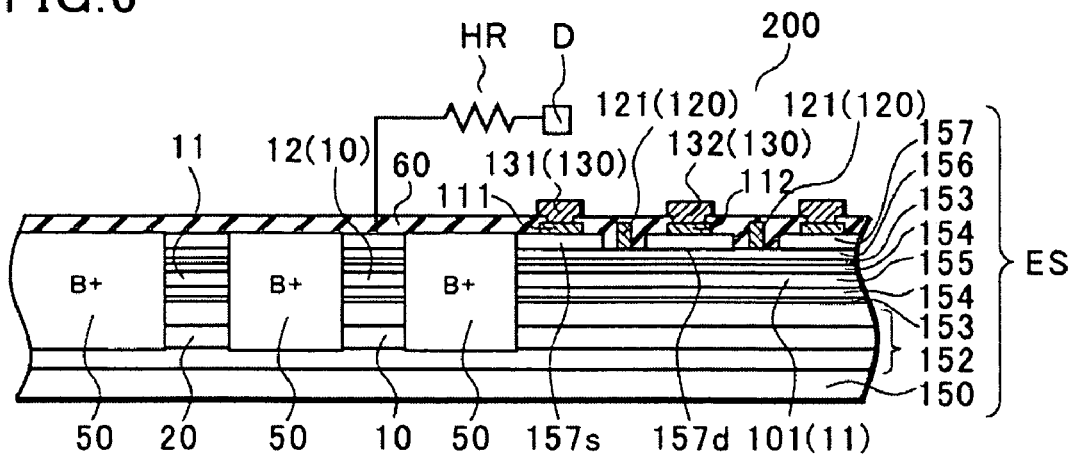
FIG. 6 is a schematic cross-sectional view for describing the first embodiments of the present invention.

FIG. 6 shows the case in which the first element is the resistor 20, and the second element is the operation region 101 of a HEMT 200. The HEMT is constructed on an epitaxial substrate ES which is a stack of a plurality of semiconductor layers on the undoped GaAs semi-insulating substrate (the compound semiconductor substrate) 150 as shown in FIG. 6.

The first and second conduction regions 11 and 12 are formed by isolating the epitaxial substrate ES by the isolation region 50.

With reference to FIG. 6, the HEMT 200 is described.

The epitaxial substrate ES is a stack in ascending order of, for example, the semi-insulating GaAs substrate 150, a undoped buffer layers 152, an n+ type AlGaAs layer 153 serving as an electron supplying layer, a undoped InGaAs layer 155 serving as a channel (electron running) layer, and the n+ type AlGaAs layer 153 serving as an electron supplying layer. A spacer layer 154 is placed between the electron supplying layer 153 and the channel layer 155.

The buffer layers 152 are a high resistance layer to which impurities are not added, and has a film thickness of about several thousands angstrom in total. The undoped AlGaAs layer serving as a barrier layer 156 is grown on the electron supply layer 153 whereby a predetermined breakdown voltage and pinch-off voltage are maintained. Furthermore, an n+ type GaAs layer 157 serving as a cap layer is grown as the uppermost layer. A high concentration of the impurities is added to the cap layer 157. The concentration of the impurities is about 1 to $5 \times 10^{18}$ cm$^{-3}$.

The electron supplying layer 153, the barrier layer 156, and the spacer layer 154 use a material having a larger band gap than that the channel layer 155 uses. The n type impurities (for example, Si) having a concentration of about 2 to $4 \times 10^{18}$ cm$^{-3}$ is added to the electron supplying layer 153.

The operation region 101 of the HEMT 200 that serves as the first conduction region 11 is formed by being isolated by the isolation region 50 that reaches the buffer layers 152. In this case, the isolation region 50 is an insulating region. The insulating region 50 is a region which is not completely electrically insulator but is insulated by providing carrier traps in the epitaxial substrate ES by ion-implanting impurities (boron, hydrogen or oxygen). That is, although impurities exist as the epitaxial layer also in the insulating region 50, the impurities are inactivated by implantation of the impurities (for example, B+) for insulation. And resistivity of the insulating region 50 is equal to or more than $1 \times 10^7$ Ω·cm and equal to or less than $1 \times 10^9$ Ω·cm. On the other hand the resistivity of insulator like glass, ceramics, gum, Si dioxide film or Si nitride film is more than $1 \times 10^{10}$ Ω·cm. Namely the insulating region 50 is clearly distinguished from insulator like glass, ceramics, gum, Si dioxide film or Si nitride film at resistivity value too. Actually the insulating region 50 is "semiconductor", and insulator like glass, ceramics, gum, Si dioxide film or Si nitride film is not "semiconductor". That is, the semiconductor and insulator are substantially different. In the present embodiment, on the epitaxial substrate ES of the HEMT 200, the regions in which the insulating region 50 is not placed are all conduction regions.

Furthermore, the epitaxial substrate ES includes the cap layer 157. The cap layer 157 has a high impurity concentration of about 1 to $5 \times 10^{18}$ cm$^{-3}$ so that the region in which the cap layer 157 is placed is functionally the conduction region containing high concentration impurities.

As shown in FIG. 6, in the operation region 101, the cap layer 157 to which high concentration impurities is added is removed in predetermined patterns to form a source region 157s and a drain region 157d. The source region 157s and drain region 157d are connected to the source electrode 111 and the drain electrode 112 which are formed of the ohmic metal layer, respectively. The source electrode 131 and the drain electrode 132 are formed thereon, respectively, using the wiring metal layer 130.

A part of the cap layer 157 in the operation region 101 is removed by etching to expose the undoped AlGaAs layer 156, and then the exposed part thereof is Schottky-connected to the gate metal layer 120 to form the gate electrode 121.

The operation region 101 of the HEMT 200 hereinafter refers to the semiconductor layers in the region which is isolated by the insulating region 50 and in which the source electrodes 111 and 131, the drain electrodes 112 and 132, and the gate electrode 121 of the HEMT 200 are placed. That is, the operation region 101 refers to the entire region which includes the HEMT 200 constructing the epitaxial substrate ES including all the electron supplying layer 153, the channel (electrons running) layer 155, the spacer layer 154, the barrier layer 156, and the cap layer 157.

The resistor 20 is also isolated by the insulating region 50 as the first conduction region 11. In FIG. 6, the separation element 10 is constructed of the second conduction region 12, which is also isolated by the insulating region 50. The impurity concentration of the separation element 10, which is typified by the impurity concentration of the cap layer 157, is about 1 to $5 \times 10^{18}$ cm$^{-3}$. The separation element 10 is here covered by the nitride film 60.

The separation element 10 is placed between the resistor 20 and the HEMT 200 and connected via the high resistance HR to the direct current terminal pad D to prevent the high frequency signals from leaking between the resistor 20 and the HEMT 200. The separation element 10 (the second conduction region 12) is also placed about 4 μm spaced apart from respective ends of the first conduction region 11.

Figure 7:
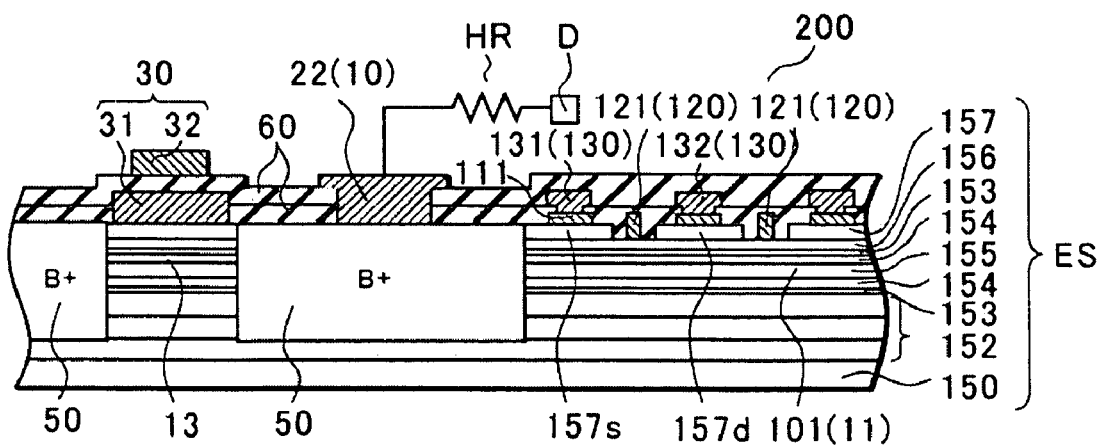
FIG. 7 is a schematic cross-sectional view for describing the first embodiments of the present invention.

FIG. 7 shows the case in which the first element is the capacitor 30, and the second element is the operation region 101 of the HEMT 200. The capacitor 30 and HEMT 200 are isolated from each other by the insulating region 50. The separation element 10 is placed therebetween. The separation element 10 is constructed of the second metal layer 22. The second metal layer 22 is placed on the insulating region 50 by forming an opening portion in the nitride film 60, for example.

The lower electrode 31 of the capacitor 30 is configured of the same metal layer as, for example, the wiring metal layer 130 of the HEMT 200. The lower electrode 31 of the capacitor 30 is then brought into contact with the third conduction region 13 isolated by the insulating region 50, thereby resulting in an improved isolation. Note that when the third conduction region 13 is not placed, the insulating region 50 is also placed beneath the capacitor 30.

Figure 8A:
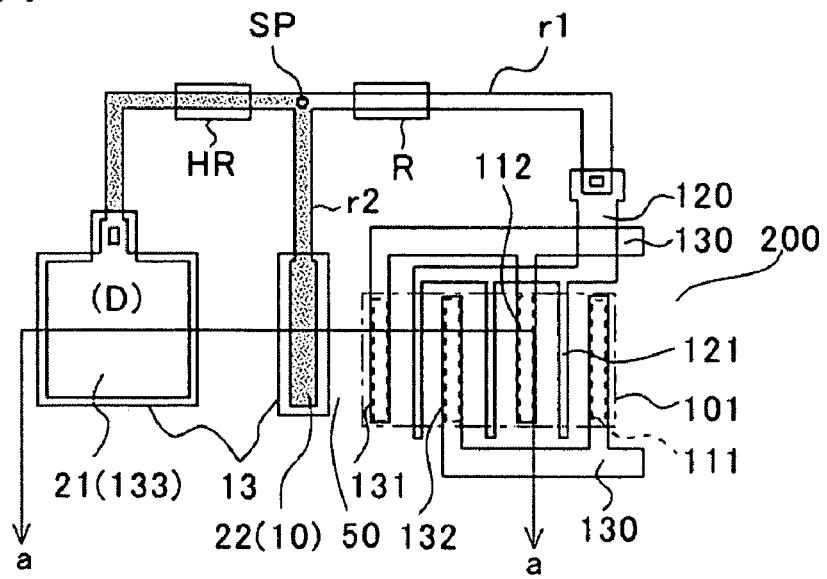
FIG. 8A is a plan view for describing the first embodiments of the present invention.
Figure 8B:
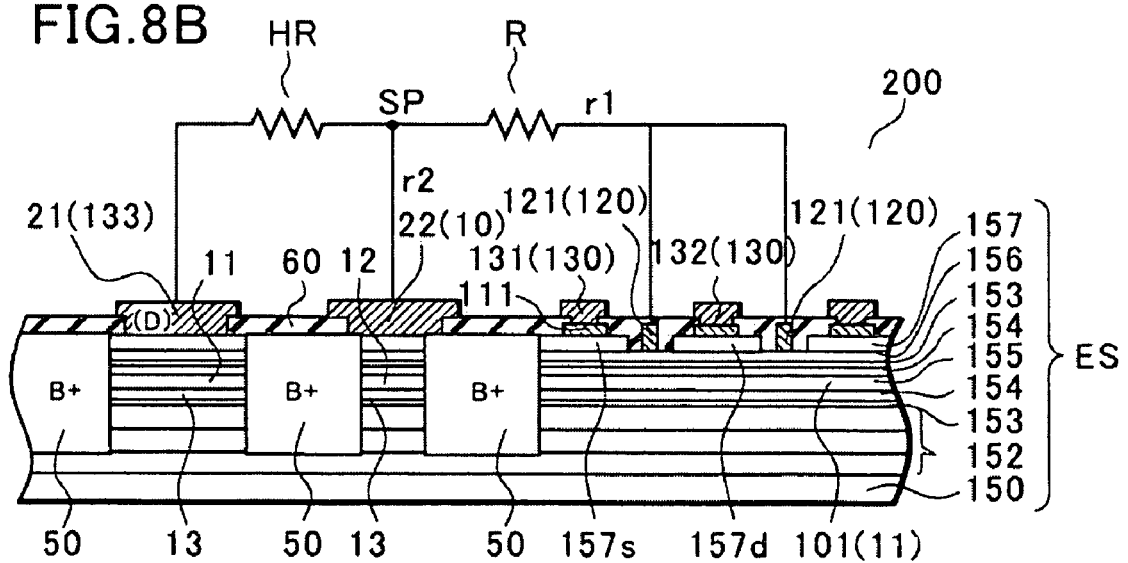
FIG. 8B is a schematic cross-sectional view for describing the first embodiments of the present invention.

FIG. 8 shows the case in which the first element is the electrode pad 133 constructed of the first metal layer 21, and the second element is the operation region 101 of the HEMT 200. FIG. 8A is a plan view, and FIG. 8B is a cross-sectional view taken along line a-a of FIG. 8A.

As shown in FIG. 8A, in the HEMT 200, two comb teeth-shaped wiring metal layers 130 extending from above is the source electrode 131, and the source electrodes 111 (depicted in dashed line) formed of the ohmic metal layer are located therebeneath. The two comb-tooth-shaped wiring metal layers (Ti/Pt/Au) 130 extending from below are the drain electrodes 132, and the drain electrodes 112 (depicted in dashed line) formed of the ohmic metal layer (AuGe/Ni/Au) are located therebeneath. The both electrodes are placed so as to have a shape formed by engaging comb teeth with each other. Between the source and drain electrodes, three comb-tooth-shaped gate electrodes 121 are placed, which are formed of the gate metal layer (for example, Pt/Mo) 120.

The operation region 101 is isolated by the insulating region 50 and formed in the region enclosed in dashed-dotted lines.

As shown in FIG. 8B, the first metal layer 21 and the HEMT 200 are isolated by the insulating region 50, and the separation element 10 is placed therebetween. The separation element 10 is configured of the second metal layer 22 which is the same metal layer as, for example, the wiring metal layer 130 of the HEMT 200. The second metal layer 22, by forming an opening portion in the nitride 60, is brought into contact with the third conduction region 13 isolated by the insulating region 50. By the third conduction region 13, an improvement in isolation around the second metal layer 22 is obtained. The junction between the second metal layer 22 and the third conduction region 13 may be either a Schottky junction or an ohmic junction.

Furthermore, the electrode pad 133 is here the direct current terminal pad D. Like this, the first element may be the direct current terminal pad D. The electrode pad 133 (the first metal layer 21) is the same metal layer as the wiring metal layer 130 of the HEMT 200, and is brought into contact with the third conduction region 13 isolated by the insulating region 50. Note that the first metal layer 21 may be placed on the insulating region 50.

FIG. 8 shows the case in which the second route r2 is partially overlapped with the first route r1, and branched at a branch point SP from the first route r1. That is, the first and second routes r1 and r2, respectively, are connected to the same direct current terminal pad D, and overlapped with each other from the direct current terminal pad D to the branch point SP. The first route r1 is branched at the branch point SP and then connected to the HEMT 200. On the other hand, the second route r2 is branched at the branch point SP to be connected to the separation element 10 as shown in FIG. 8A. The second route r2 is the route indicated by hatching. The second route r2 is not completely overlapped with the first route r1, and therefore not included in the first route r1.

However, as shown in FIG. 8A, the high resistance element HR is connected between the branch point SP and the direct current terminal pad D when the second route r2 is branched from the first route r1. Another resistance element R having a high resistance value (5 kΩ to 10 kΩ or more) is necessary to be placed in the first route r1 extending from the branch point SP to a transistor to which the high frequency signals transmit. This is described below.

When the second element (HEMT) is turned off, a high frequency current does not flow in a channel layer (the operation region 101 between the source region and the drain region) of the second element. Therefore, the potential of the gate electrode 121 being in Schottky junction with the surface of the operation region 101 of the second element does not vibrate with high frequency. That is, the potential of the first and second routes r1 and r2, respectively, does not vibrate with high frequency in any part. The first and second routes r1 and r2, respectively, are overall at high frequency GND potential. As a result, the high frequency GND potential is arranged between the first and second elements, whereby the leak of high frequency signals does not occur.

Meanwhile, when the second element is turned on, high frequency signals are transmitted in the operating region of the second element so that the potential of the gate electrode 121 being in Schottky junction with the surface of the operating region of the second element vibrates with high frequency. Therefore, the potential close to the gate electrode 121 in the first route r1 vibrates with high frequency like the gate electrode 121. However, in the first route r1, the another resistance element R having a resistance value of 5 kΩ to 10 kΩ or more is connected between the branch point SP and the gate electrode 121, whereby the potential amplitude which vibrates with high frequency close to the gate electrode 121 of the second element is sufficiently attenuated by the resistance element R. That is, the branch point SP between the first and second routes is at high frequency GND potential similar to the potential of the direct current terminal pad D.

Thus, the potential in the second route r2 almost does not vibrate with high frequency, whereby the potential of the separation element 10 is at high frequency GND potential. As a result, by the placement of the separation element 10 (high frequency GND potential) between the first and second elements, high frequency can be prevented from leaking between the first and second elements.

Moreover, when high frequency signals having very large amplitude leak from, for example, the second element to the separation element 10, the potential itself of the separation element 10 is affected by the high frequency signals to slightly vibrate with high frequency in some cases. However, in this case, the amplitude of the high frequency vibrations is extremely smaller than the case in which the separation element 10 is at a floating potential. Even if the high frequency vibrations are transmitted to the first element, it is at a low level. Furthermore, in this case, the vibrations of the potential of the separation element 10 are sufficiently attenuated by the high resistance element HR so that the vibrations are not transmitted to the direct current terminal pad D. That is, the second route r2 does not transmit the high frequency vibrations of the potential of the separation element 10 to the direct current terminal pad D. Therefore, the high frequency properties of the circuit device is not deteriorated.

As described above, in the present embodiment, the second route r2 which connects the separation element 10 to the direct current terminal pad D is the route in which the high frequency vibrations of potential thus almost do not occur. Also, even if, as described above, the large amplitude high frequency signals from either the first or second element leak to the separation element 10 so that the potential of the isolation region 50 between the first and second elements vibrates with high frequency, the second route r2 can absorb the high frequency vibrations of the isolation region 50. That is, the second route r2 is the route which absorbs the high frequency vibrations of the potential of the isolation region 50 so as not to transmit the high frequency vibrations to the direct current terminal pad D.

Therefore, when the separation element 10 is connected to the direct current terminal pad D common to the transistor (the HEMT 200) to branch the second route r2 from the first route r1 at the branch point SP, the high resistance element HR is placed between the branch point SP and the direct current terminal pad D. In addition, in the first route r1, the another resistance element R having a resistance value of 5 kΩ to 10 kΩ or more is placed between the branch point SP and the gate electrode 121 (the operation region 101). This allows the potential in the second route r2 almost not to vibrate with high frequency, whereby the potential of the separation element 10 is at the high frequency GND potential.

The above description uses the HEMT as an example, and also is true when the HEMT is replaced with an FET. The first element may be the wiring 134 which is the first metal layer 21.

Figure 9:
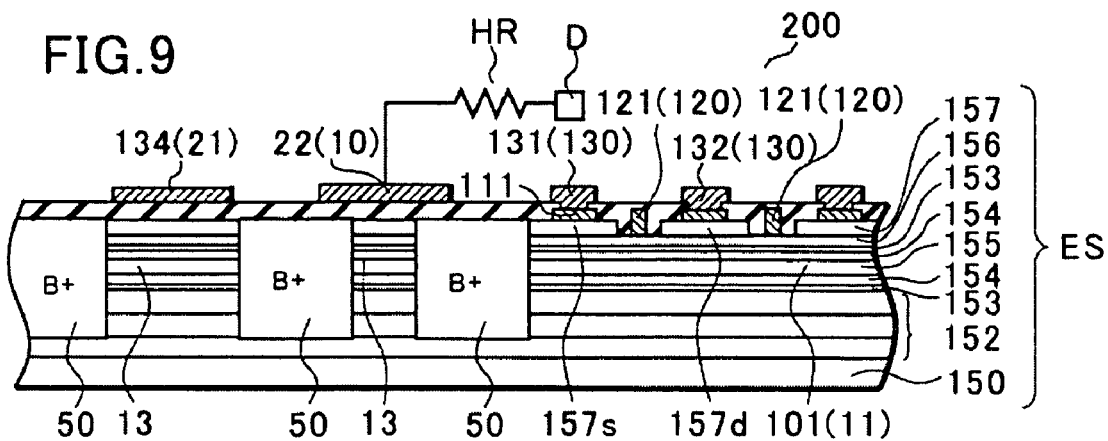
FIG. 9 is a schematic cross-sectional view for describing the first embodiments of the present invention.

FIG. 9 shows the case in which the first element is the wiring 134 (the first metal layer 21) extending on the nitride film 60, and the second element is the operation region 101 of the HEMT 200. The wiring 134 and the HEMT 200 are isolated from each other by the insulating region 50. The separation element 10 is placed therebetween. The separation element 10 here is configured of the second metal layer 22. Furthermore, the third conduction region 13 is placed via the nitride film 60 beneath the second metal layer 22 to improve isolation. The second metal layer 22 is DC-insulated from the third conduction region 13.

The third conduction region 13 is placed via the nitride film 60 beneath the wiring 134. The insulating region 50 may be placed beneath the wiring 134.

Figure 10:
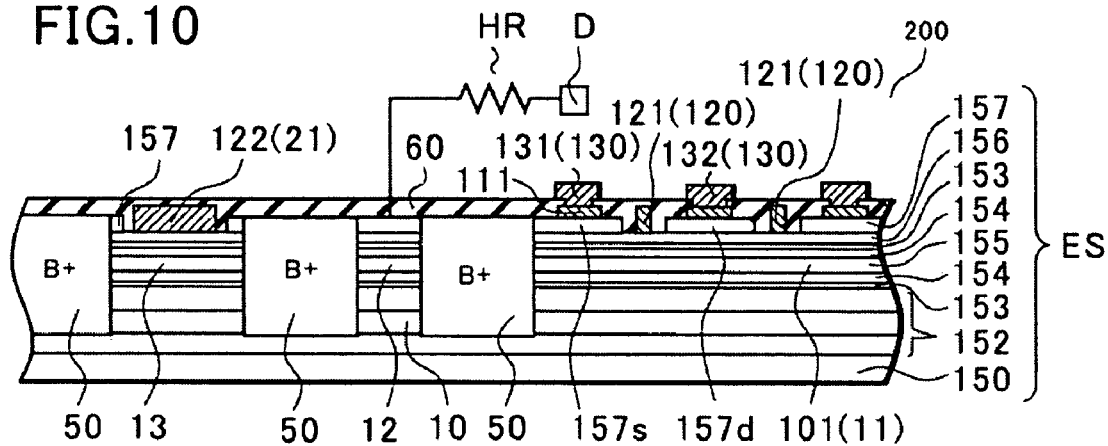
FIG. 10 is a schematic cross-sectional view for describing the first embodiments of the present invention.

FIG. 10 shows the case in which the first element is the gate wiring 122 which is the first metal layer 21, and the second element is the operation region 101 of the HEMT 200. The HEMT 200 and the gate wiring 122 are isolated from each other by the insulating region 50. The separation element 10 is placed therebetween. The separation element 10 is connected via the high resistance element HR to the direct current terminal pad D. The separation element 10 here is constructed of the second conduction region 12.

The gate wiring 122 is the same gate metal layer 120 as that of the gate electrode 121 of the HEMT 200. The gate wiring 122 is formed on the barrier layer 156 which is exposed by etching the cap layer 157 as in the case of the gate electrode 121. In FIG. 10, the gate wiring 122 is isolated by the insulating region 50 such that the cap layer 157 is left around the gate wiring 122. This causes the third conduction region 13 to be placed around the gate wiring 122, thereby resulting in improved isolation. The insulating region 50 may be placed beneath the gate wiring 122.

Figure 11:
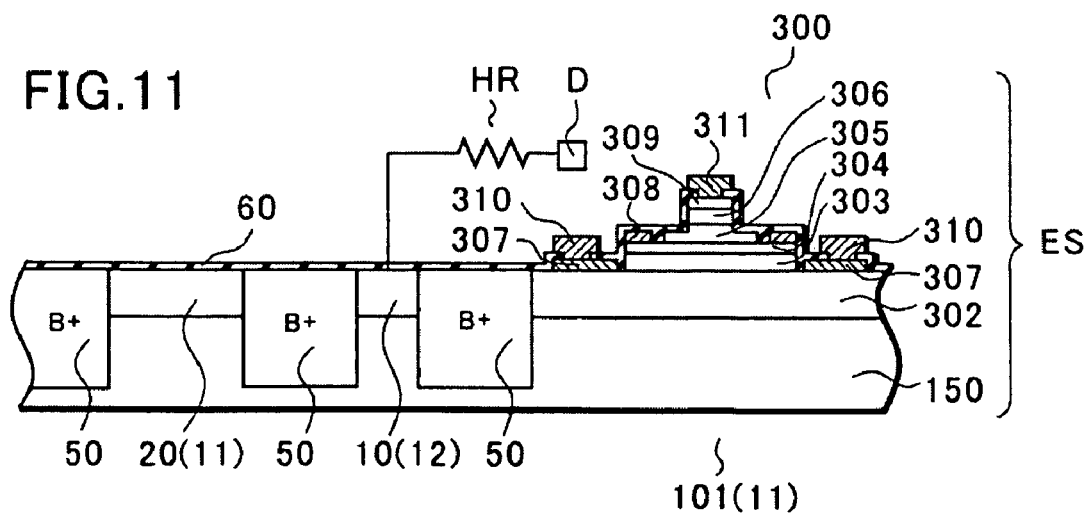
FIG. 11 is a schematic cross-sectional view for describing the first embodiments of the present invention.

FIG. 11 shows the case in which the first element is the resistor 20, and the second element is the operation region 101 of an HBT 300. As shown in FIG. 11, the HBT 300 is a bipolar transistor which is formed by etching an epitaxial substrate ES which is a stack of a plurality of semiconductor layers having a heterojunction in predetermined patterns on the compound semiconductor substrate 150 and providing an emitter layer, a base layer, and collector layer to form a mesa structure.

The first element which is integrated on the same substrate 150 as that for the HBT 300 and separation element 10 are formed on any semiconductor layer for the HBT 300. They are respectively formed by isolating the semiconductor layer by the isolation region 50.

With reference to FIG. 11, an example of the HBT 300 is described.

A sub-collector layer 302, which is of n+ type of GaAs layer, is formed on the semi-insulating GaAs substrate 150. On the sub-collector layer 302, a collector layer 303 of an n type InGaP layer, a base layer 304 of p type GaAs layer, an emitter layer 305 of an n type InGaP layer, and a cap layer 306 of an n+ type GaAs layer are grown to form a mesa type. The collector layer 303 is formed on a partial region of the sub-collector layer 302, and doped in an impurity concentration of about 1 to $5 \times 10^7$ cm$^{-3}$ by silicon doping. The layer thickness is 1000 to 5000 Å. The base layer 304 is doped in an impurity concentration of about 1 to $50 \times 10^{18}$ cm$^{-3}$ by carbon (C) doping. The layer thickness is several hundreds to 5000 angstrom. The emitter layer 305 is formed on a partial region of the base layer 304, and doped in an impurity concentration of about 1 to $10 \times 10^{17}$ cm$^{-3}$ by silicon doping. The layer thickness is 1000 to 5000 angstrom. The emitter layer 305 is lattice-matched with upper and lower GaAs layers. The cap layer 306 is formed on the emitter layer 305, and doped in an impurity concentration of about 3 to $6 \times 10^{18}$ cm$^{-3}$ by silicon doping. The layer thickness is several thousands angstrom. The collector layer 303 and emitter layer 305 may be an AlGaAs layer instead of an InGaP layer.

FIG. 11 shows, as an example, the structure in which the emitter layer 305 and the base layer 304 form an InGap/GaAs heterojunction, as well as the collector layer 303 and base layer 304 form an InGap/GaAs heterojunction. This structure is suitable for the use for a switching element, i.e., is an emitter-collector symmetric type of the structure. However, the HBT structure is not limited to this. For example, the collector layer 303 may be an n− type GaAs layer.

On the surface of the sub-collector layer 302, collector electrodes 307 are placed as the first collector electrode formed of an ohmic metal layer (AuGe/Ni/Au) in a position in which the collector layer 303 is sandwiched. On the surface of the base layer 304, a base electrode 308 formed of an ohmic metal layer (Pt/Ti/Pt/Au) is placed in a pattern which surrounds the emitter layer 305. On the cap layer 306, emitter electrode 309 is placed as the first emitter electrode formed of the ohmic metal layer (AuGe/Ni/Au). On the collector electrode 307 and the emitter electrode 309, a collector electrode 310 and an emitter electrode 311 are provided, respectively, by a wiring metal layer (Ti/Pt/Au) as the second collector electrode and the second emitter electrode.

The operation region 101 of the HBT 300 which is to serve as the first conduction region 11 is formed by being isolated by the isolation region 50 which reaches the semi-insulating substrate 150. In this case, the isolation region 50 is an insulating region. The insulating region 50 is a region which is not completely electrically insulator but is insulated by providing carrier traps in the epitaxial substrate ES by ion-implanting impurities (boron, hydrogen or oxygen). That is, although impurities exist as the epitaxial layer also in the insulating region 50, the impurities are inactivated by implantation of the impurities (boron, hydrogen or oxygen) for insulation. In the present embodiment, on the epitaxial substrate ES for the HBT 300, the regions in which the insulating region 50 is not placed are all conduction regions.

Also, the epitaxial substrate ES includes the sub-collector layer 302 on the overall surface of the substrate. The sub-collector layer 302 has a high impurity concentration of about 1 to $5 \times 10^{18}$ cm$^{-3}$ so that the region in which the sub-collector layer 302 is placed is functionally the conduction region containing the high concentration impurities.

The operation region 101 of the HBT 300 hereinafter refers to the semiconductor layer in the region which is isolated by the insulating region 50, and in which the collector electrodes 307 and 310, the base electrode 308, and the emitter electrodes 309 and 311 are placed. That is, the operation region 101 refers to the entire region which includes the HBT 300 constructing epitaxial substrate ES including all the sub-collector layer 302, the collector layer 303, the base layer 304, the emitter layer 305, and the cap layer 306.

The resistor 20 as the first conduction region 11 is formed by isolating the sub-collector layer 302 by the insulating region 50. In FIG. 1, the separation element 10 is constructed of the second conduction region 12, which is isolated by providing the isolation region 50 to the sub-collector layer 302. The separation element 10 has an impurity concentration of about 1 to $5 \times 10^{18}$ cm$^{-3}$. The nitride film 60 here is provided on the separation element 10. The separation element 10 is placed between the resistor 20 and the HBT 300, and connected via the high resistance element HR to the direct current terminal pad D so that the high frequency signals can be prevented from leaking between the resistor 20 and the HBT 300. The separation element 10 (the second conduction region 12) is placed about 4 μm spaced apart from respective ends of the first conduction region 11.

Figure 12:
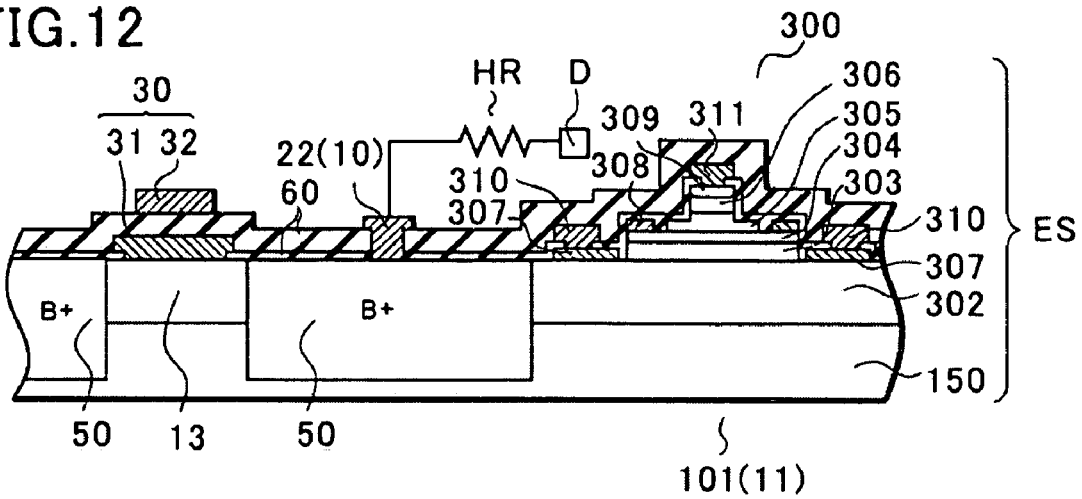
FIG. 12 is a schematic cross-sectional view for describing the first embodiments of the present invention.

FIG. 12 shows the case in which the first element is the capacitor 30, and the second element is the operation region 101 of the HBT 300. The capacitor 30 and the HBT 300 are isolated from each other by the insulating region 50. The separation element 10 is therebetween. The separation element 10 is constructed of the second metal layer 22. The second metal layer 22 is placed on the insulating region 50 by forming an opening portion in the nitride film 60, for example.

The lower electrode 31 of the capacitor 30 is constructed of the same metal layer as, for example, the wiring metal layer of the HBT 300. The lower electrode 31 of the capacitor 30 is then brought into contact with the third conduction region 13 formed by isolating the sub-collector layer 302 by the insulating region 50, thereby resulting in an improved isolation.

When the third conduction region 13 is not placed, the insulating region 50 is placed beneath the capacitor 30.

Figure 13:
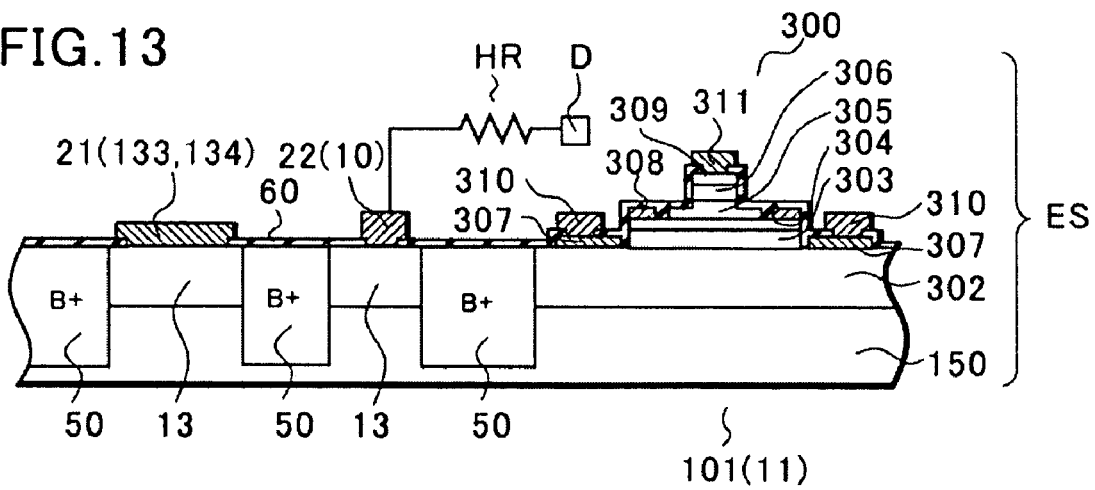
FIG. 13 is a schematic cross-sectional view for describing the first embodiments of the present invention.

FIG. 13 shows the case in which the first element is the electrode pad 133 or the wiring 134 which is the first metal layer 21 respectively, and the second element is the operation region 101 of the HBT 300. The first metal layer 21 and the HBT 300 are isolated from each other by the insulating region 50. The separation element 10 is placed therebetween. The separation element 10 is constructed of the second metal layer 22 which is the same metal layer as, for example, the wiring metal layer of the HBT 300. The second metal layer 22, for example, by forming an opening portion in the nitride film 60 is brought into contact with the third conduction region 13 isolated by the insulating region 50. The third conduction region 13 allows an improvement in isolation to be obtained around the second metal layer 22. The second metal layer 22 may be in a Schottky or an ohmic junction with the third conduction region 13.

The first metal layer 21 (the electrode pad 133 or the wiring 134) is the same metal layer as the wiring metal layer of the HBT 300, and is brought into contact with the third conduction region 13 isolated by the insulating region 50. Note that the first metal layer 21 may be placed on the insulating region 50.

Figure 14:
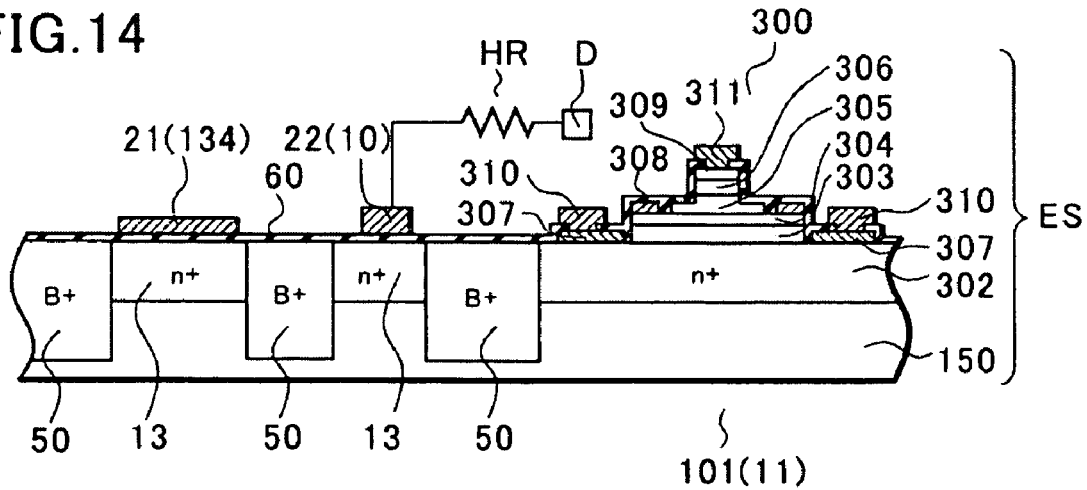
FIG. 14 is a schematic cross-sectional view for describing the first embodiments of the present invention.

FIG. 14 shows the case in which the first element is the first metal layer 21 (the wiring 134) extending onto the nitride film 60, and the second element is the operation region 101 of the HBT 300. The wiring 134 and the HBT 300 are isolated from each other by the insulating region 50, and the separation element 10 is placed therebetween. The separation element 10 here is constructed of the second metal layer 22. Beneath the second metal layer 22, the third conduction region 13 is placed via the nitride film 60 to improve isolation. The second metal layer 22 is DC-insulated from the third conduction region 13.

Beneath the wiring 134, the third conduction region 13 is also placed via the nitride film 60. The insulating region 50 may be placed beneath the wiring 134.

The above descriptions have been given with reference to the figures, but the combination of the first and second elements is not limited to those shown in the figures. The construction of the separation element 10 and the combination of the first and second elements are not limited to those shown in the figures.

FIG. 15 is a table which shows the kinds of the first and second elements, and the construction of the separation element 10. FIG. 15A shows the kinds of the first and second elements. FIG. 15B shows the configuration of the separation element 10. In the present embodiment, all combinations of the first and second elements and the separation element 10 are available as shown in this table.

When the separation element 10 is the second metal layer 22, and the third conduction region 13 is placed therebeneath, the separation element 10 and the third conduction region 13 may be either directly fixed to each other to form a Schottky or an ohmic junction or DC-isolated from each other via an insulating film. Furthermore, the third conduction region 13 may be placed about 5 μm spaced apart from and around the separation element 10 on the surface of the substrate beneath the separation element 10, and DC-connected to the separation element 10.

In a case where, in the first and second elements, and the separation element 10, the third conduction region 13 is provided therebeneath, the combinations of the pattern of the third conduction region 13 are not limited to those shown in FIGS. 1 to 14. That is, a pattern in which the third conduction region 13 is provided only around the element, and a pattern in which the region is provided overall surface beneath the element, can be accordingly selected with respect to each element to combine them.

Figure 16:
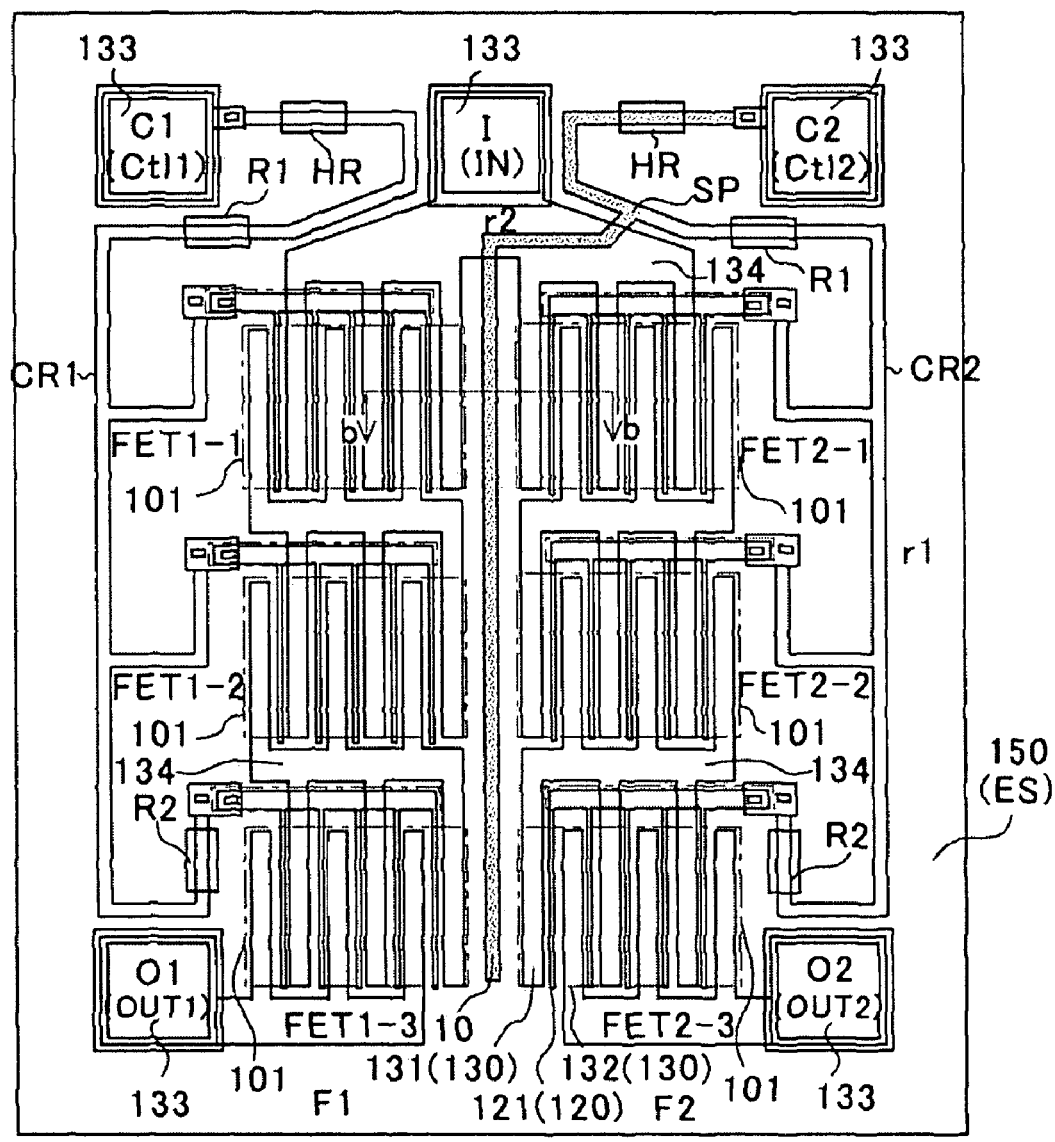
FIG. 16 is a plan view for describing a second embodiments of the present invention.

With reference to FIGS. 16 and 17, as a second embodiment, an example is shown in which the separation element 10 is placed between elements which constructs the switch circuit device.

FIG. 16 is a plan view which shows the switch circuit device. The switch circuit device is a high power SPDT (Single Pole Double Throw) including two switching elements having a plurality of FETs connected each other in multiple stages, for example.

Two FET groups (the first FET group F1, and the second FET group F2) which perform switching are placed on a GaAs substrate (a compound semiconductor substrate) 150. In the first FET group F1, three FETs, for example, FET1-1, FET1-2, and FET1-3 are connected in series. In the second FET group F2, three FETs, for example, FET2-1, FET2-2, and FET2-3 are connected in series. Electrode pads I, O1, O2, C1, and C2 which are connected to a common input terminal IN, output terminals OUT1 and OUT2, control terminals Ctl1 and Ctl2, respectively, are provided around the substrate 150.

A first and second control resistances CR1 and CR2 are respectively connected to each of six gate electrodes 121 which construct each FET group. A high resistance element HR, and another high resistance elements R1 and R2 are connected to the first control resistance CR1 on the route extending from the gate electrode 121 of each FET to a first control terminal pad C1 in order to prevent the high frequency signals from leaking.

The high resistance element HR, and the another high resistance elements R1 and R2 are similarly also connected to the second control resistance CR2 on a route extending from the gate electrode 121 of each FET to the second control terminal pad C2.

The gate electrode 121 of each FET is constructed of a gate metal layer (for example, Pt/Mo) 120. A wiring 134 which connects the elements to each other and the electrode pads (I, O1, O2, C1 and C2) 133 are constructed of a wiring metal layer (Ti/Pt/Au) 130. A source electrode 131 and a drain electrode 132 which are located as the second source electrode and the second drain electrode of the each FET are also constructed of the wiring metal layer 130. An ohmic metal layer (AuGe/Ni/Au) being in ohmic contact with the substrate forms a source electrode and a drain electrode in the first source electrode and the first drain electrode of each FET. The ohmic metal layer is not shown in FIG. 16 because it is overlapped with the wiring metal layer 130.

The first FET group F1 and the second FET group F2 are placed symmetrically with respect to the center line of the chip, and have the same configuration. Therefore, the only first FET group F1 is described below. Also, in the switch circuit device, the source electrode and the drain electrode are equivalent to each other. Therefore, description is given by using one of them.

In the FET1-1, three comb-tooth-shaped wiring metal layers 130 extending from above are the source electrodes 131 connected to the common input terminal pad I. The source electrode formed of an ohmic metal layer is located therebeneath. Three comb-tooth-shaped wiring metal layers 130 extending from below are the drain electrodes 132 of the FET1-1. The drain electrode formed of the ohmic metal layer is located therebeneath. The both electrodes are placed so as to have a shape formed by engaging comb teeth with each other. The gate electrodes 121 formed of the gate metal layer 120 are placed therebetween so as to have a five comb-tooth shape.

An operation region 101 is formed in the region enclosed in dashed-dotted lines either a region formed by ion-implantation into, for example, the GaAs semi-insulating substrate 150, or an epitaxial substrate ES which is grown to be a plurality of semiconductor layers on the GaAs semi-insulating substrate 150 and is isolated by an insulation layer 50.

In the FET1-2, three source electrodes 131 extending from above are connected to the drain electrode 132 of the FET1-1. Since these electrodes here are just a passing station of the high frequency signals, and thus generally not needed to be led to the outside, a pad is not provided. Three drain electrodes 132 extending from below are connected to the source electrode 131 of the FET1-3. Since these electrodes are similarly just a passing station of the high frequency signals, and thus generally not needed to be led to the outside, a pad is not provided. Beneath the both electrodes, the ohmic metal layer is provided. These electrodes are placed so as to have a shape formed by engaging comb teeth with each other. The gate electrodes 121 formed of the gate metal layer 120 are placed therebetween in five comb-tooth shape. The switch circuit device including the FETs connected in series in multiple stages can be cut off against larger voltage amplitude when the FET group is turned off as compared to the switch circuit device including a single FET so that it becomes a high power switch circuit device. Then, the source or drain electrode of the FET which is a connection part for connecting the FETs in series is generally not needed to be led to the outside so that a pad is not provided.

In the FET1-3, three comb-tooth shaped wiring metal layers 130 extending from above are the source electrodes 131. The source electrode formed of an ohmic metal layer is located therebeneath. Three comb-teeth shaped wiring metal layers 130 extending from below are the drain electrodes 132 connected to the output terminal pad O1. The drain electrode formed of the ohmic metal layer is located therebeneath. The both electrodes are placed so as to have a shape formed by engaging comb teeth with each other. Between the source and drain electrodes, five comb-tooth-shaped gate electrodes 121 are placed, which are formed of the gate metal layer 120.

In this case, the first element is the operation region 101 of the first FET group F1, and the second element is the operation region 101 of the second FET group F2. The first and second elements are isolated from each other by the isolation region 50. However, their patterns are in proximity to each other.

In order to surely prevent the leak of the high frequency signals between the first and second elements which are in proximity to each other in pattern, the separation element 10 being at a high frequency GND potential is placed between the first and second elements. The separation element 10 is applied via the high resistance element HR of 5 kΩ to 10 kΩ or more with a high frequency GND potential by, for example, connecting the second control terminal pad C2 thereto.

Figure 17A:
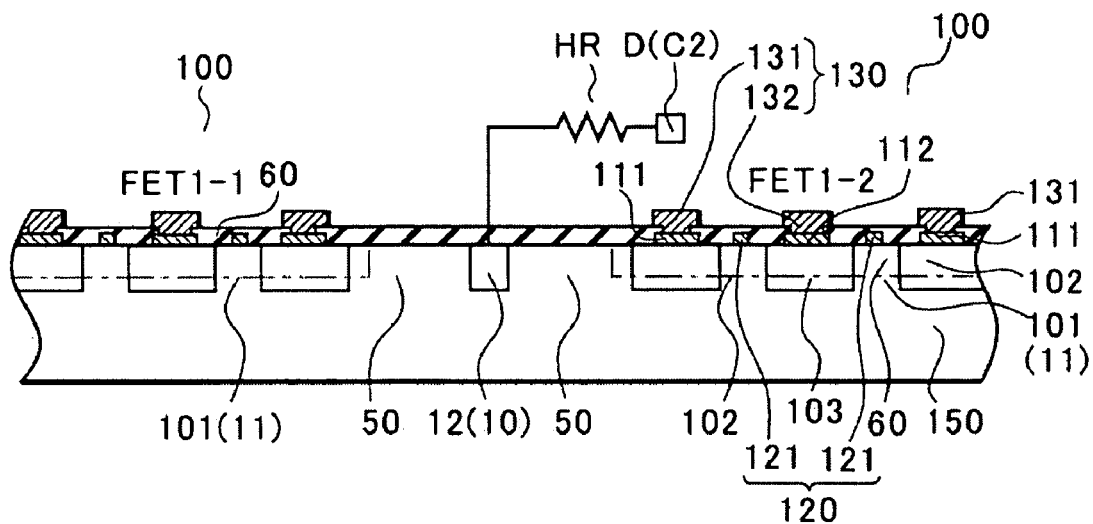
FIG. 17 is a schematic cross-sectional view for describing the second embodiments of the present invention.
Figure 17B:
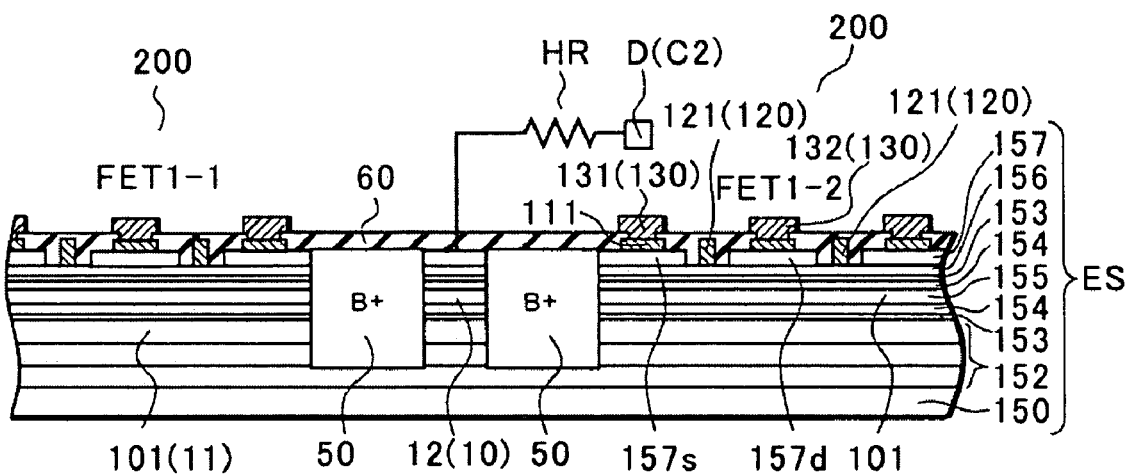

FIG. 17 is a cross-sectional view taken along line b-b of FIG. 16. FIG. 17A shows the MESFET. FIG. 17B shows the HEMT. The MESFET and the HEMT are different from each other in the structure of the substrate on which they are integrated, but are the same as each other in a planar pattern as shown in FIG. 16.

As shown in FIG. 17A, the operation regions 101 of two FETs (FET1-1, FET2-1) which are to be the first and second elements are placed on the GaAs substrate 150. These are isolated by a part of the GaAs (semi-insulating) substrate 150. A MESFET 100 of the first and second elements is the same as the one shown in FIG. 1.

The separation element 10 is placed between the two elements. The separation element 10 here is a second conduction region 12 which is formed by ion-implanting high concentration n type impurities. The high resistance element HR connected to the separation element 10 is formed through an ion-implantation process through which the operation region 101 is formed.

FIG. 17B shows the case in which the first and second elements are the operation region 101 of a HEMT 200. The HEMT 200 is the same as the one, for example, shown in FIG. 6. The separation element 10, which here is the second conduction region 12, is formed by placing the insulating regions 50 on both sides thereof between the first and second elements. The high resistance element HR connected to the separation element 10 is formed by etching n+ type GaAs layer of a cap layer 157.

With reference back to FIG. 16, the separation element 10 is connected via the high resistance element HR to, for example, the second control terminal pad C2. The second control terminal pad C2 is connected via the second control resistor CR to the gate electrode 121 of each FET of the second FET group F2 to apply a direct current potential to each FET.

That is, a direct current terminal pad D of the separation element 10 is the second control terminal pad C2, and serves as an electrode pad which applies control signals to the MESFET 100 which is the second element. In the present embodiment, when the separation element 10 thus shares the direct current terminal pad D with the MESFET 100, the separation element 10 is connected to the direct current terminal pad D through a route which is different from the connection route of the MESFET 100.

The operation regions 101 of the second element and the second control terminal pad C2 which is the direct current terminal pad D are connected to each other through a first route r1. That is, the first route r1 is a connection route extending from the second control terminal pad C2 through the high resistance element HR, a branch point SP, the second control resistor CR2 to each gate electrode 121 (the operation region 101) of the FET2-1, FET2-2, and FET2-3.

Meanwhile, the separation element 10 is connected to the second control terminal pad C2 through a second route r2 which is branched from the first route r1 at the branch point SP. That is, the second route r2 is, as shown by a hatching, a connection route extending from the second control terminal pad C2 through the high resistance element HR and the branch point SP to the separation element 10.

In the first embodiment of the present invention as already described, the first route r1 and second route r2 may be a route each extending from one of the direct current terminal pads. The second route r2 may be a route which is branched from the first route r1. That is, the second route r2 is not completely overlapped with the first route r1, thus not included in the first route r1.

However, when the second route r2 is branched from the first route r1 as shown in FIG. 16, the high resistance element HR is placed between the branch point SP and the direct current terminal pad D. Furthermore, the another resistance elements R1 and R2 having a high resistance value (5 kΩ to 10 kΩ or more) are needed to be connected in the first route r1 extending from the branch point SP to the transistor (FETs). This is described below.

When the second element (the second FET group F2) is turned off, a high frequency current does not flow in the operation region 101 between the source region and the drain region of the second element. Therefore, the potential of the gate electrode 121 which is in Schottky junction with the surface of the operation region of the second element also does not vibrate with high frequency. That is to say, the potential of the first and second routes r1 and r2, respectively, does not vibrate with high frequency in any portion thereof. The first and second routes r1 and r2, respectively, are at high frequency GND potential entirely. As a result, the high frequency GND potential is applied between the first and second elements, whereby the leak of the high frequency signals does not occur.

On the other hand, when the second element is turned on, the high frequency current flows in the operating region of the second element so that the potential of the gate electrode 121 which is in Schottky junction with the surface of the channel layer of the second element also vibrates with high frequency. Therefore, the potential close to the gate electrode 121 of the first route r1 vibrates with high frequency similarly to the gate electrode 121. However, in the first route r1, the another resistance elements R1 and R2 having a resistance value of 5 kΩ to 10 kΩ or more are connected between the branch point SP and the gate electrode 121. Therefore, the potential that vibrates with high frequency close to the gate electrode 121 of the second element is sufficiently attenuated by the resistance elements R1 and R2. That is, the branch point SP between the first and second routes r1 and r2, respectively, is at the high frequency GND potential similarly to the potential of the second control terminal pad C2.

Thus, the potential in the second route r2 almost does not vibrate with high frequency so that the potential of the separation element 10 is at the high frequency GND potential. As a result, the placement of the separation element 10 (at the high frequency GND potential) between the first and second elements allows the high frequency signals to be prevented from leaking between the first and second elements.

Also, when high frequency signals having very large amplitude leak from, for example, the first element to the separation element 10, the potential itself of the separation element 10 is influenced by the high frequency signals and slightly vibrates with high frequency in some cases. However, in this case, the amplitude of the high frequency vibrations is extremely small as compared to the separation element 10 being at a floating potential. Even if the high frequency vibrations are transmitted to the second element, the amount is minute. Furthermore, in this case, the vibrations of the potential of the separation element 10 are sufficiently attenuated by the high resistance element HR so that the vibration does not reach the direct current terminal pad D. That is to say, the second route r2 does not transmit the high frequency vibrations being at the potential of the separation element 10 to the direct current terminal pad D so that the high frequency properties of the circuit device is not deteriorated.

Thus, in the present embodiment, the second route r2 which connects the separation element 10 to the direct current terminal pad D is a route in which the high frequency vibrations of potential almost do not occur. Furthermore, as described above, when the high frequency signals having a large amplitude leak from the first or second element to the separation element 10 so that the potential of the isolation region 50 between the first and second elements vibrates with high frequency, the high frequency vibrations of the isolation region 50 can be absorbed by the second route r2. That is, the second route r2 absorbs the high frequency vibrations of the potential of the isolation region 50 so that the high frequency vibrations are not transmitted to the direct current terminal pad D.

For this purpose, when the separation element 10 is connected to the direct current terminal pad D (the second control terminal pad C2) common to the transistor (FET) to branch the second route r2 from the first route r1 at the branch point SP, the high resistance element HR is placed between the branch point SP and the direct current terminal pad D. Then, in the first route r1, the another resistance elements R1 and R2 having a resistance value of 5 kΩ to 10 kΩ or more are connected between the branch point SP and the gate electrode 121 (the operation region 101). This allows the potential almost not to vibrate with high frequency in the second route r2, whereby the potential of the separation element 10 is at the high frequency GND potential.

There may be to separately extend the first and second routes r1 and r2 from the direct current terminal pad D in stead of branching. In this case, the second route r2 is not influenced by the high frequency vibrations of the first route r1. Therefore, if the high resistance element HR is placed on the second route r2, there is no restriction in another pattern.

Description has been given so far using a multi-stage SPDT switch MMIC as an example. However, the configuration of the switch circuit device is not limited to the above described examples. A switch circuit device having different number of input and output ports such as SP3T, SP4T, DP4T, DP7T, may be used. Moreover, it does not matter that a switch circuit device is provided with a logic circuit or not. Furthermore, a shunt FET which prevents the high frequency signals from leaking may be connected to the output terminal on an OFF side.

According to the embodiments of the present invention the following effects can be obtained.

By use of a separation element, it is possible to prevent high frequency signals from leaking between two elements, which are the first and second elements placed in proximity to each other. The separation element is connected via a high resistance element to a direct current terminal pad to which a direct current potential is applied. The resistance value of the high resistance element is 5 kΩ to 10 kΩ or more. The direct current terminal pad is being at a GND potential as a high frequency signal. That is to say, the separation element is not at a floating potential but at a direct current potential (at a GND potential as a high frequency signal).

Specifically, even when high frequency signals leak from at least one of the first and second elements to reach the separation element, the potential of the separation element hardly varies due to the leaked signals. Furthermore, even when high frequency signals leak, they do not leak to the ground being at the GND potential as high frequency.

Therefore, for example, in a case of a switch MMIC, an increase in insertion loss does not occur. Moreover, improvement in isolation between the first and second elements can be more effectively obtained as compared to that in the conventional structure.

What is claimed is:

1. A compound semiconductor device comprising:
   a compound semiconductor substrate comprising a top surface portion;
   a transistor formed on the substrate and receiving a signal in a GHz frequency range, a drain and a source of the transistor being formed in the top surface portion of the substrate;
   a first direct current terminal connected with the transistor and applying a direct current to the transistor;
   a device element formed in or on the substrate adjacent the transistor;
   an isolation region disposed between the device element and the transistor;
   a separation element that is conductive and disposed on or in a top surface portion of the isolation region;
   a high resistance element formed on the substrate, the separation element being connected with a pad for a second direct current terminal through the high resistance element, the high resistance element being only a portion of a wiring connection between the pad and the separation element and comprising a portion of the semiconductor substrate that has a resistance higher than the rest of the wiring connection; and
   wherein the isolation region is part of the top surface portion of the substrate in which the drain and the source are formed.

2. The compound semiconductor device of claim 1, wherein the device element comprises a conductive region.

3. The compound semiconductor device of claim 1, wherein the device element comprises a metal layer.

4. The compound semiconductor device of claim 1, wherein the separation element is disposed between the device element and an operation region of the transistor.

5. The compound semiconductor device of claim 3, wherein the metal layer is part of a wiring or an electrode pad.

6. The compound semiconductor device of claim 1, wherein the device element comprises a capacitor.

7. The compound semiconductor device of claim 1, wherein the separation element comprises a conductive region formed in the substrate or a metal layer formed on the substrate.

8. The compound semiconductor device of claim 7, further comprising an additional conductive region disposed under the metal layer.

9. The compound semiconductor device of claim 8, further comprising an insulating film disposed between the metal layer and the additional conductive region.

10. The compound semiconductor device of claim 8, wherein the metal layer and the additional conductive region form a Schottky junction or an ohmic junction.

11. The compound semiconductor device of claim 1, wherein the first direct current terminal and the second direct current terminal are the same direct current terminal.

12. The compound semiconductor device of claim 1, wherein the transistor is a FET, a HEMT or an HBT.

13. The compound semiconductor device of claim 1, wherein the substrate is a semi-insulating substrate and the isolation region is part of the semi-insulating substrate.

14. The compound semiconductor device of claim 1, wherein the substrate is a semiconductor and the isolation region is a region of the substrate made insulated by ion-implantation.

15. The compound semiconductor device of claim 1, wherein the transistor is part of a switch circuit.

16. The compound semiconductor device of claim 1, wherein the high resistance element is configured to absorb high frequency vibrations of potential of the isolation region.

17. The compound semiconductor device of claim 11, wherein the transistor and the separation element share the same electric path including the high resistance element at least between an end point of the high resistance element and the same direct current terminal.

18. The compound semiconductor device of claim 17, further comprising an additional high resistance element connected between the high resistance element and the transistor.

* * * * *